(12) United States Patent
Teraki

(10) Patent No.: US 9,163,885 B2
(45) Date of Patent: Oct. 20, 2015

(54) COOLER AND REFRIGERATING APPARATUS INCLUDING THE SAME

(75) Inventor: Junichi Teraki, Shiga (JP)

(73) Assignee: Daikin Industries, Ltd., Osaka (JP)

( * ) Notice: Subject to any disclaimer, the term of this patent is extended or adjusted under 35 U.S.C. 154(b) by 336 days.

(21) Appl. No.: 13/821,875

(22) PCT Filed: Sep. 27, 2011

(86) PCT No.: PCT/JP2011/005428
§ 371 (c)(1),
(2), (4) Date: Mar. 8, 2013

(87) PCT Pub. No.: WO2012/042849
PCT Pub. Date: Apr. 5, 2012

(65) Prior Publication Data
US 2013/0160485 A1    Jun. 27, 2013

(30) Foreign Application Priority Data

Sep. 30, 2010    (JP) .................. 2010-221214

(51) Int. Cl.
| F25B 1/00 | (2006.01) |
|---|---|
| F28F 1/40 | (2006.01) |
| H01L 23/473 | (2006.01) |
| F28F 13/02 | (2006.01) |
| F28F 13/06 | (2006.01) |
| F28F 13/12 | (2006.01) |

(Continued)

(52) U.S. Cl.
CPC ... *F28F 1/40* (2013.01); *F25B 1/00* (2013.01); *F25D 19/006* (2013.01); *F28F 13/02* (2013.01); *F28F 13/06* (2013.01); *F28F 13/12* (2013.01); *H01L 23/473* (2013.01); *F25B 13/00* (2013.01); *F25B 2313/021* (2013.01); *H01L 2924/0002* (2013.01)

(58) Field of Classification Search
CPC ............. F25B 1/10; F25B 39/02; F25B 13/00
USPC ........ 62/498, 527, 119, 509, 515, 525, 324.1; 165/104.11
See application file for complete search history.

(56) References Cited

U.S. PATENT DOCUMENTS 1,923,363 A * 8/1933 Fredrickson et al. ........... 62/399
3,473,348 A * 10/1969 Bottum ........................... 62/513

(Continued)

FOREIGN PATENT DOCUMENTS

| JP | 58-104866 U | 7/1983 |
|---|---|---|
| JP | 59-113681 U | 8/1984 |

(Continued)

OTHER PUBLICATIONS

International Search Report issued in PCT/JP2011/005428, mailed on Nov. 8, 2011.

*Primary Examiner* — Melvin Jones
(74) *Attorney, Agent, or Firm* — Birch, Stewart, Kolasch & Birch, LLP

(57) ABSTRACT

A cooler includes a circular pipe member through which a heating medium circulates, and being in thermal contact with a power module to cool the power module with the heating medium flowing through an interior of the circular pipe member. An axially extending channel formation member between which and an inner circumferential surface of the circular pipe member a narrow channel for the heating medium is formed is provided in the circular pipe member.

19 Claims, 24 Drawing Sheets

(51) Int. Cl.
*F25D 19/00* (2006.01)
*F25B 13/00* (2006.01)

(56) References Cited

U.S. PATENT DOCUMENTS

| | | | |
|---|---|---|---|
| 5,157,944 A * | 10/1992 | Hughes et al. | 62/515 |
| 5,617,737 A * | 4/1997 | Christensen et al. | 62/487 |
| 6,363,730 B1 * | 4/2002 | Thomas et al. | 62/62 |
| 6,370,844 B1 * | 4/2002 | Stricker | 53/446 |
| 2010/0192624 A1 | 8/2010 | Teraki et al. | |

FOREIGN PATENT DOCUMENTS

| | | |
|---|---|---|
| JP | 63-223496 A | 9/1988 |
| JP | 2-004163 A | 1/1990 |
| JP | 4-002156 A | 1/1992 |
| JP | 6-037219 A | 2/1994 |
| JP | 8-145405 A | 6/1996 |
| JP | 2000-196276 A | 7/2000 |
| JP | 2008-121985 A | 5/2008 |

* cited by examiner

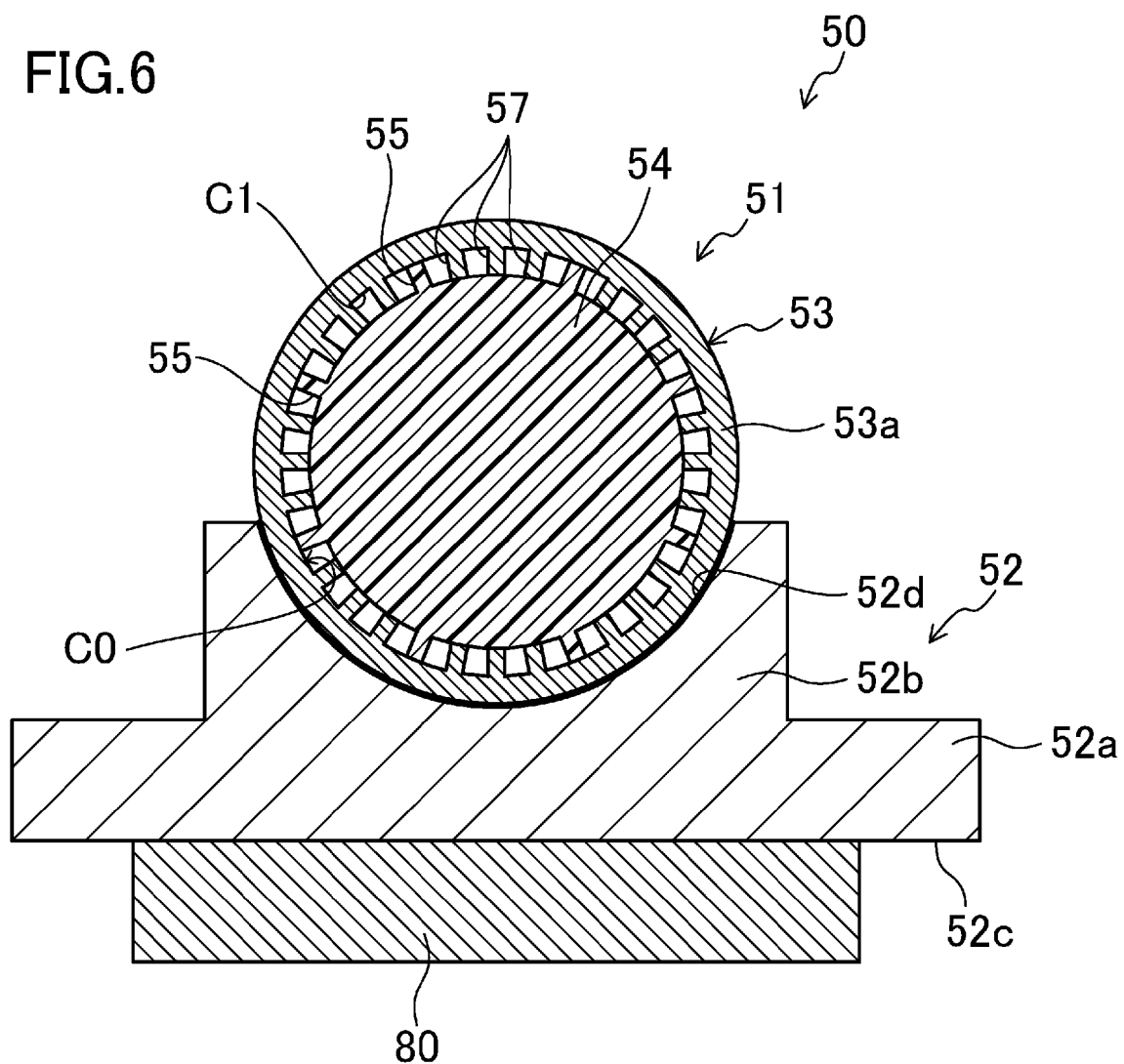

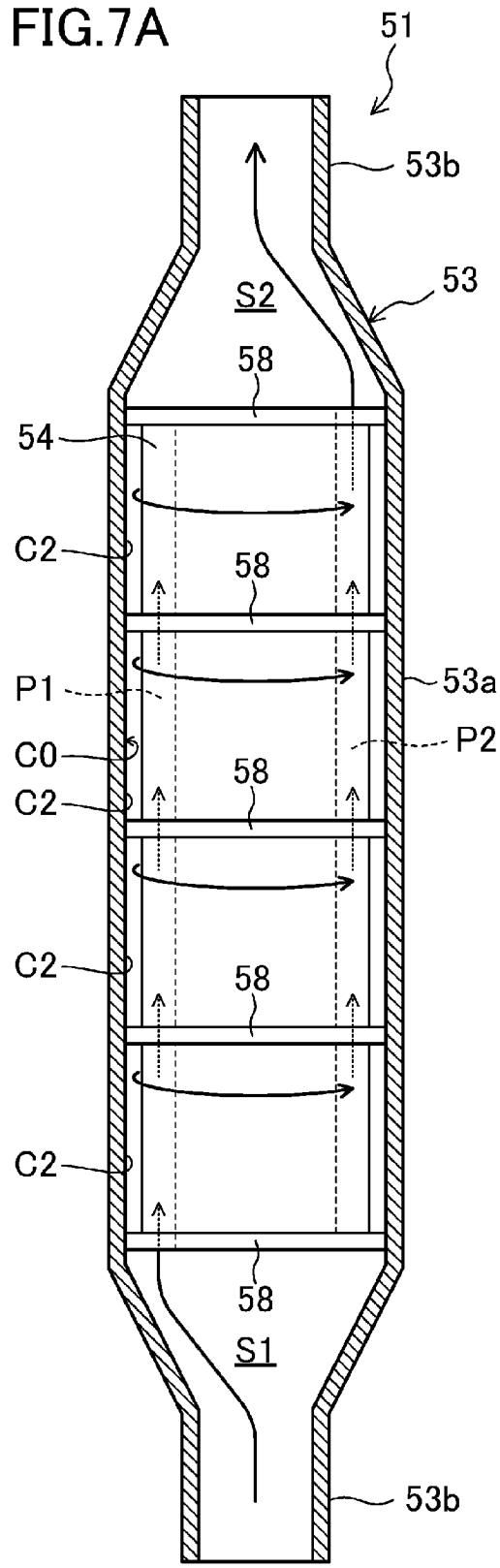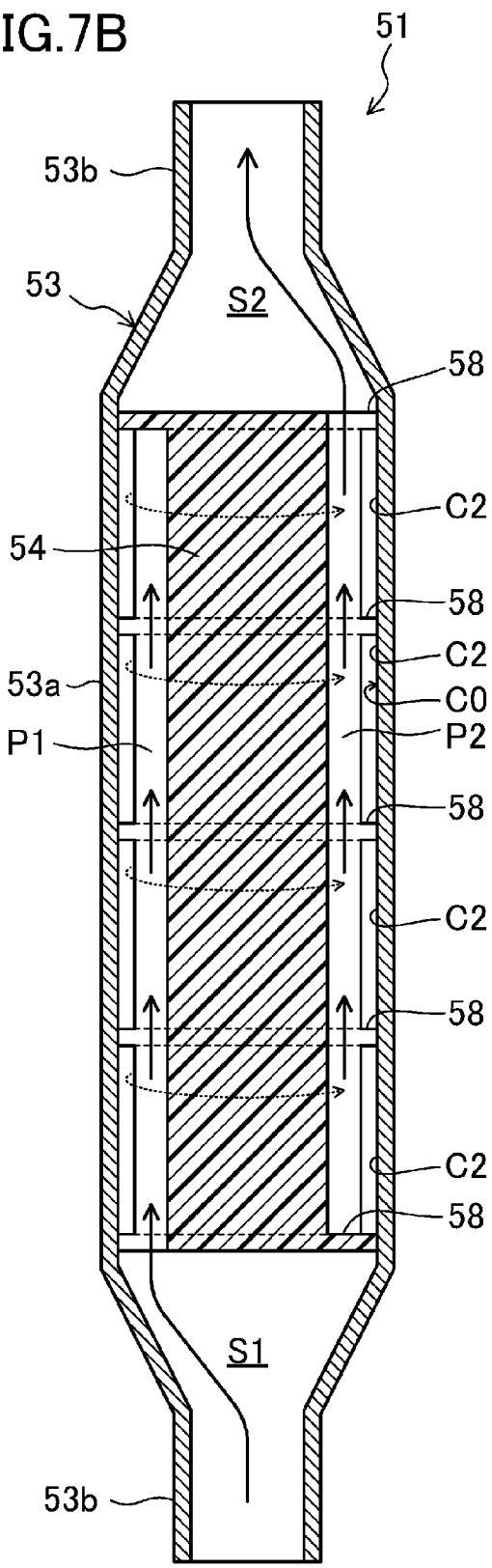

FIG.12A
FIG.12B
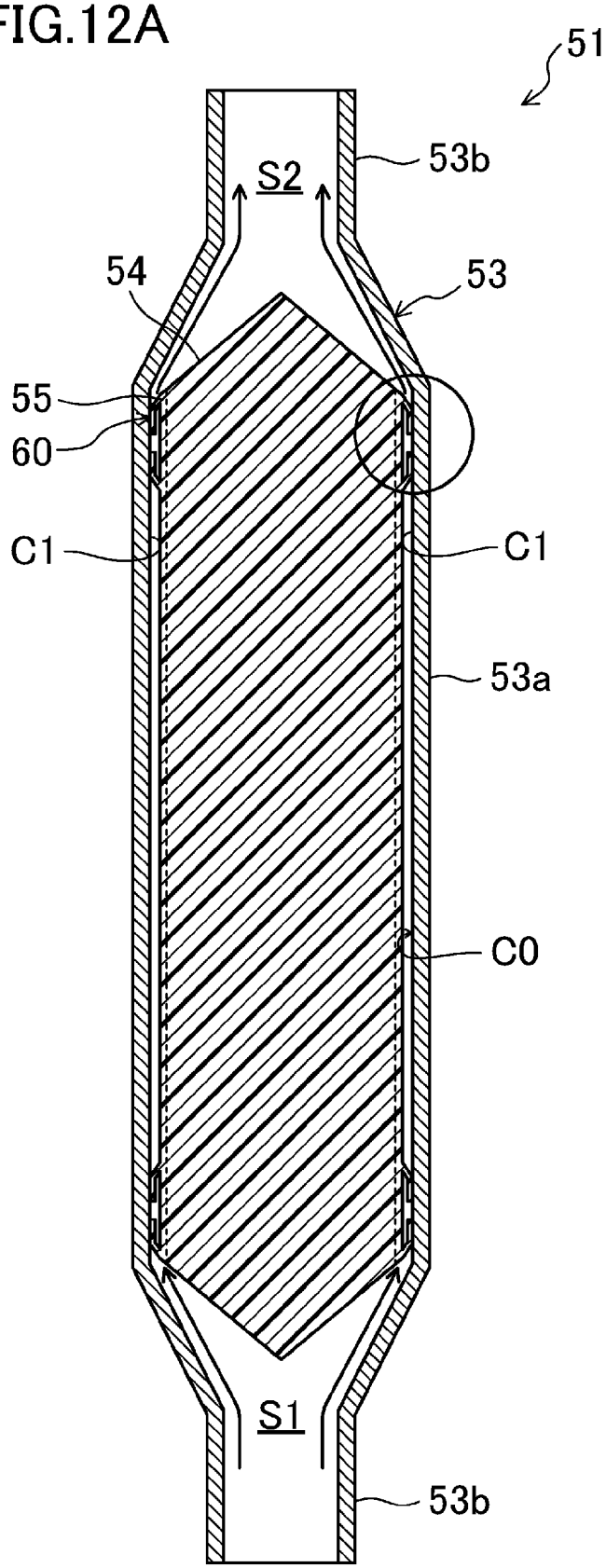
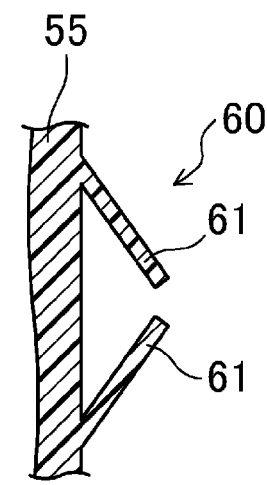
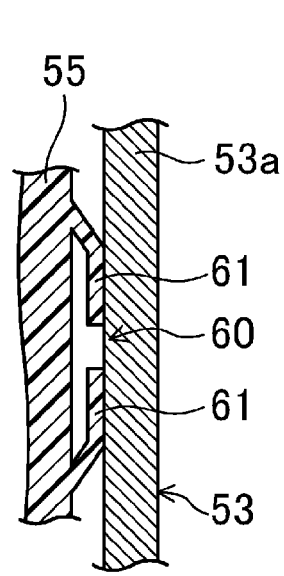

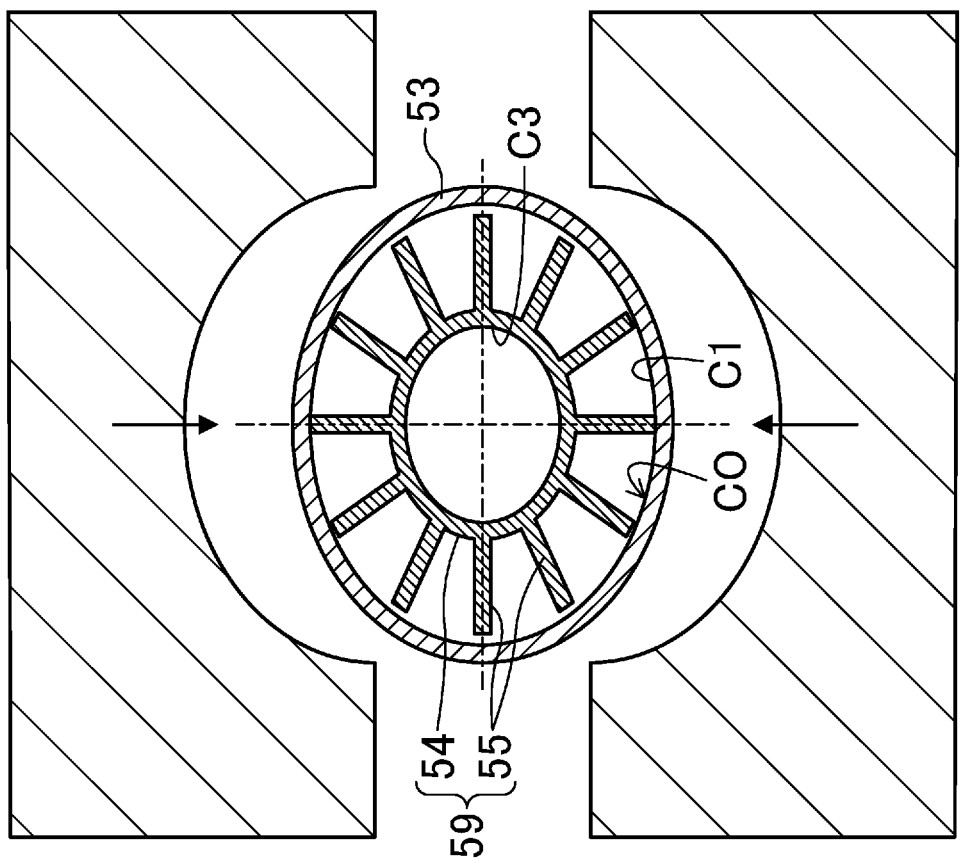
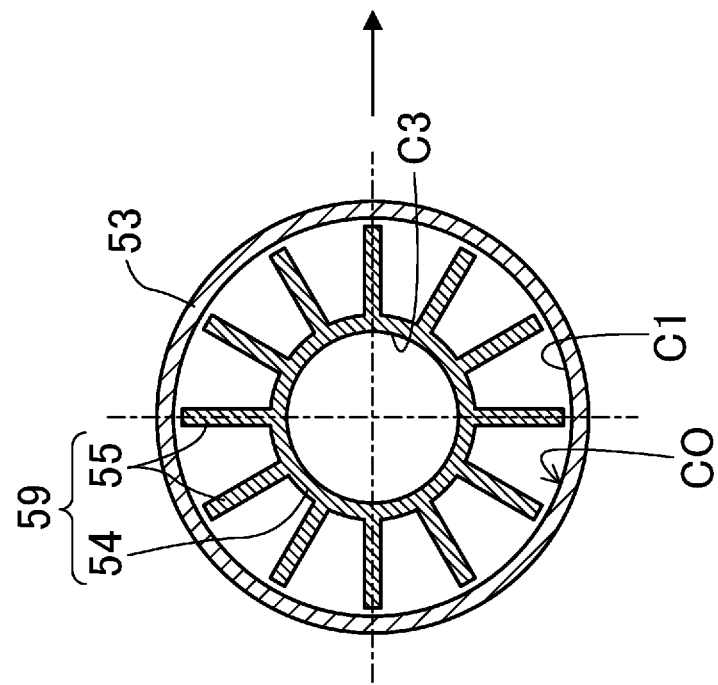

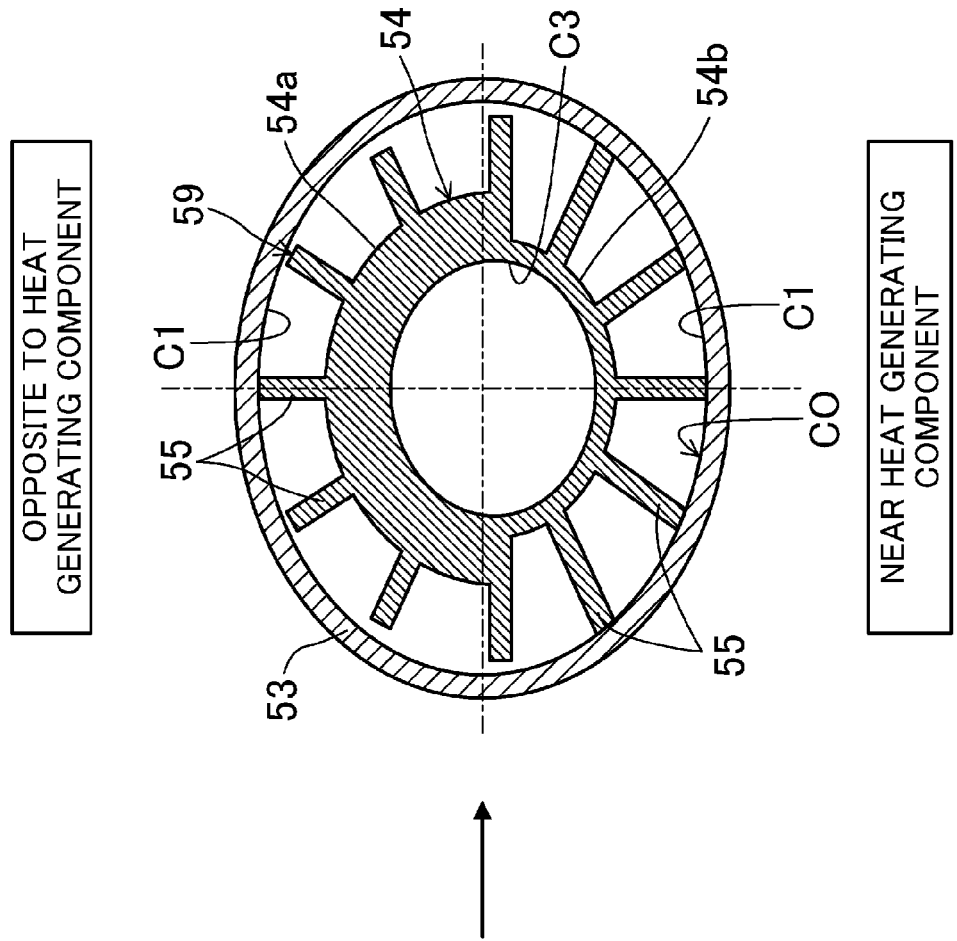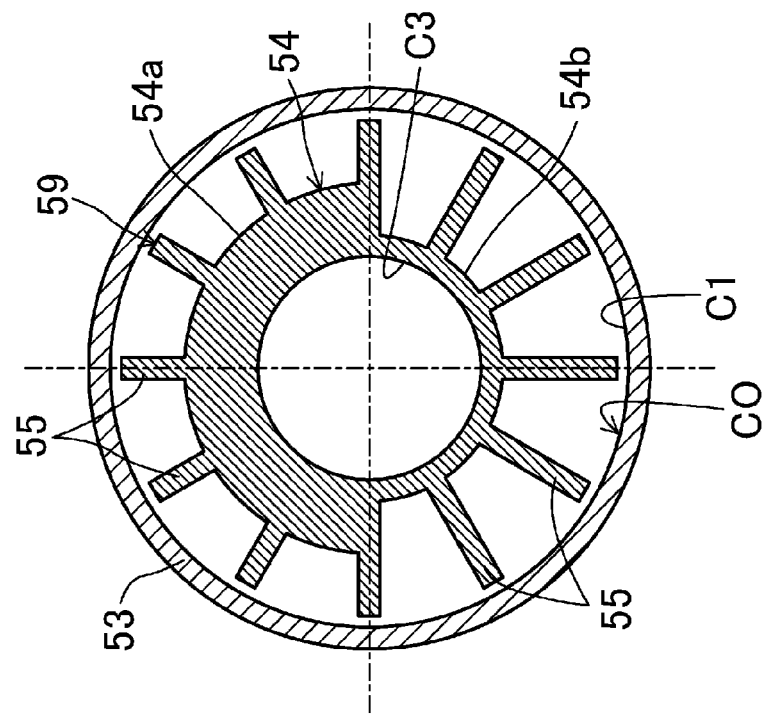

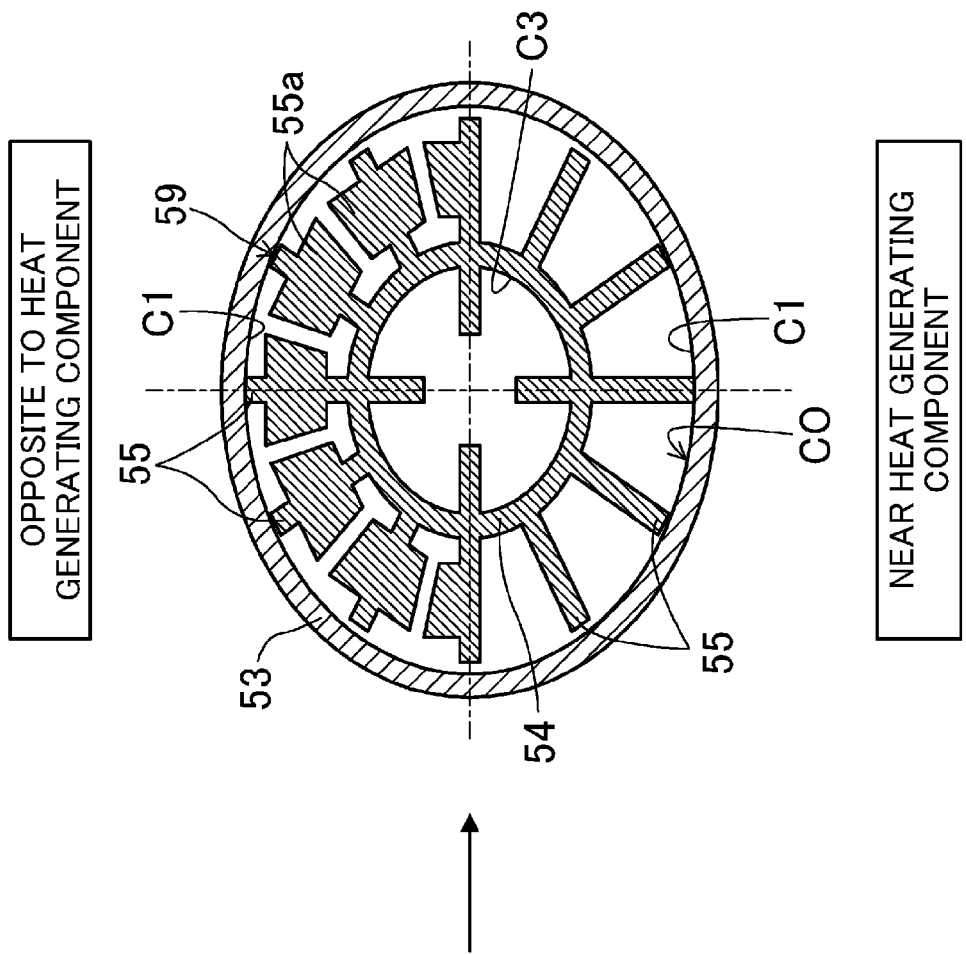

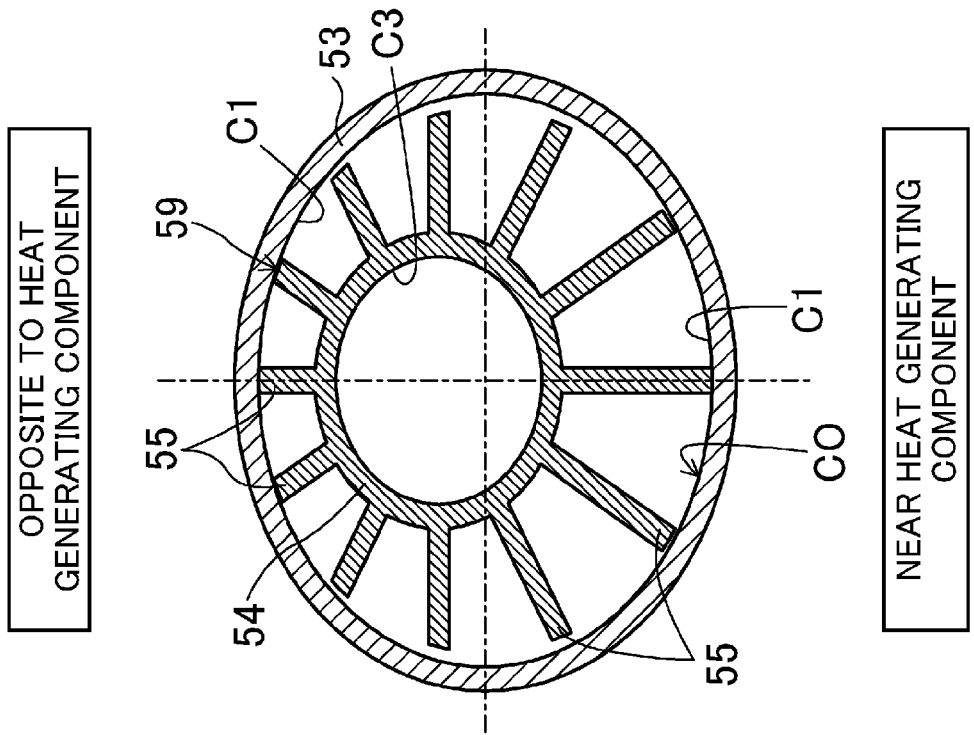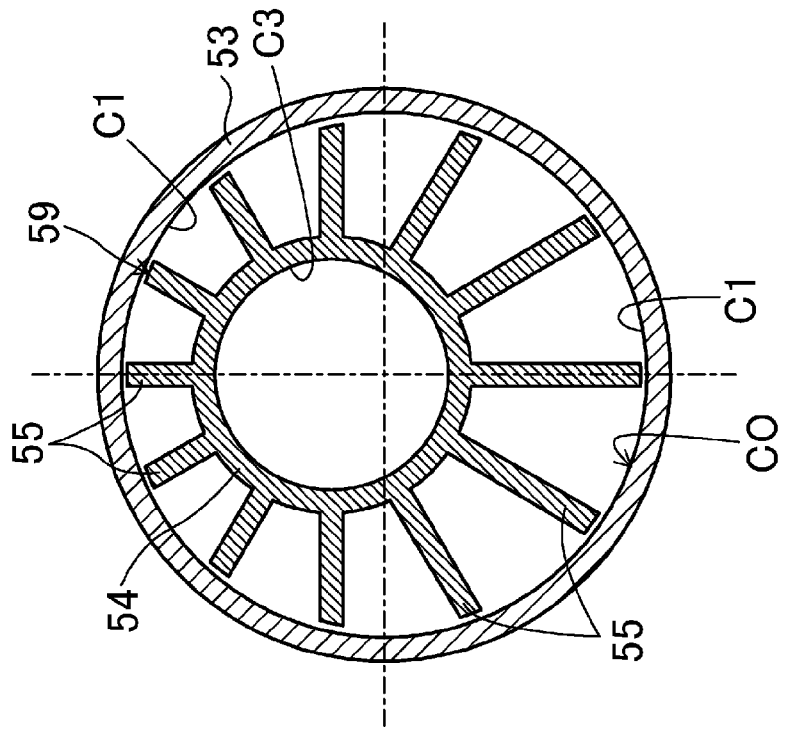

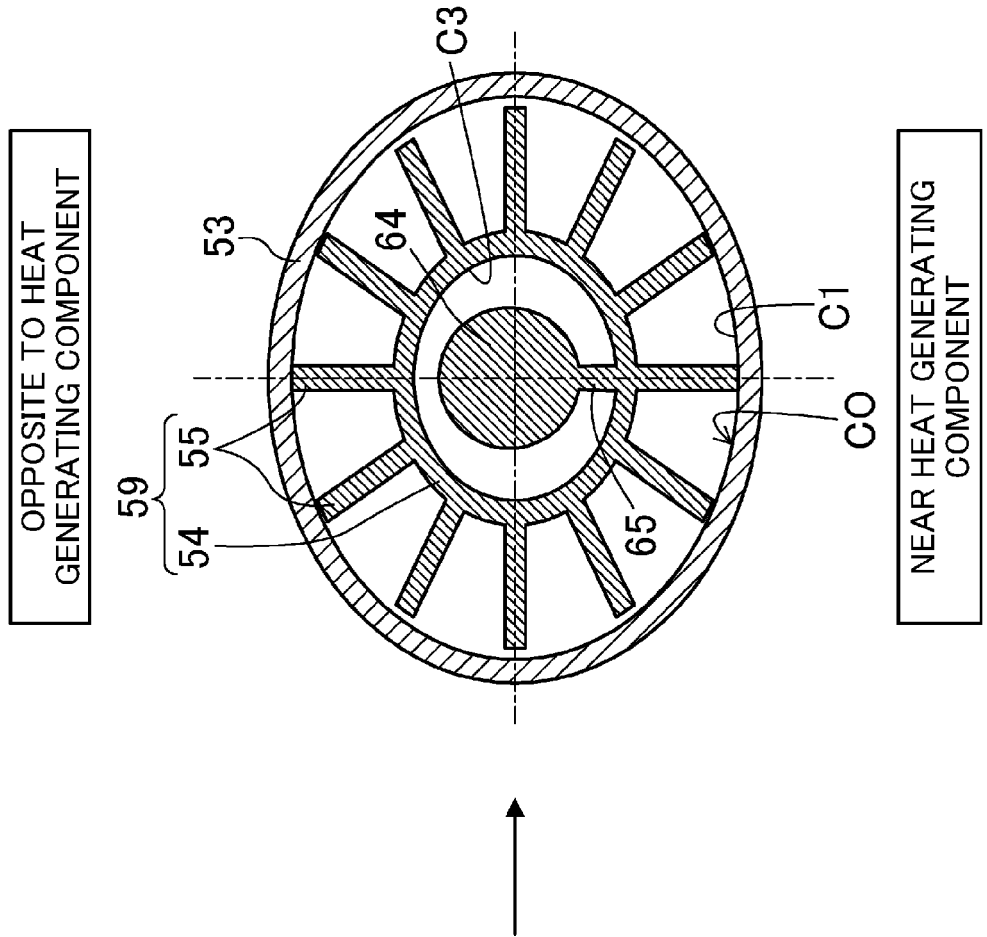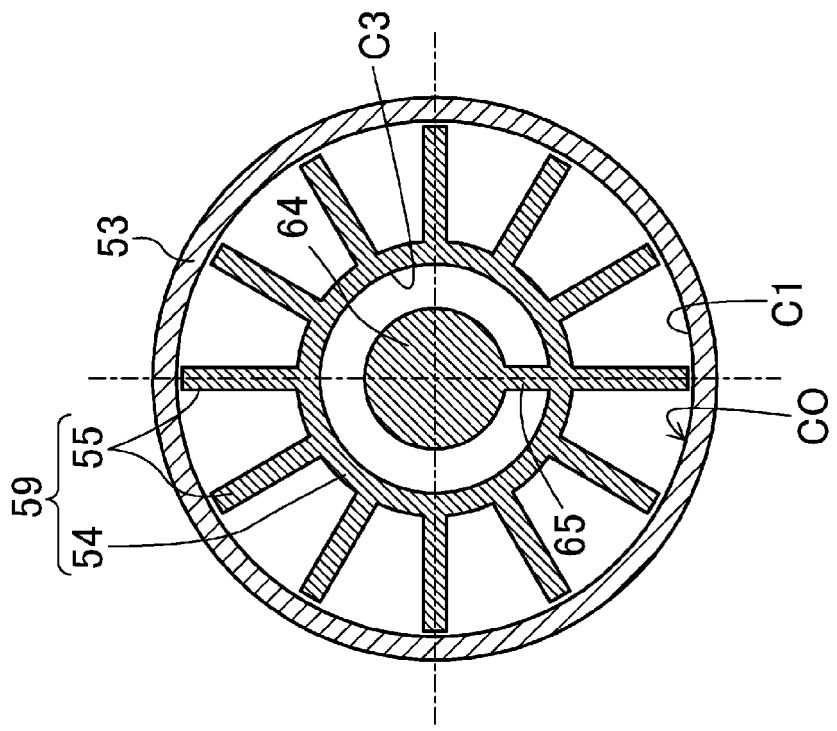

COOLER AND REFRIGERATING APPARATUS INCLUDING THE SAME

TECHNICAL FIELD

The present invention relates to coolers through which a heating medium circulates to cool a heat generating component, and refrigerating apparatuses including the same.

BACKGROUND ART

Conventionally, a cooler provided within a heating medium channel through which a heating medium circulates, such as a refrigerant circuit, and configured to cool a heat generating component, such as a power module, with a heating medium circulating through the cooler has been used (see, for example, PATENT DOCUMENT 1). The cooler includes a circular pipe connected to a suction pipe of a refrigerant circuit which performs a vapor compression refrigeration cycle, and forming a portion of the suction pipe, and a heat transfer plate used to mount a power module to the circular pipe. The cooler cools the power module by releasing heat generated from the power module through the heat transfer plate to a low-temperature refrigerant flowing through the circular pipe.

CITATION LIST

Patent Document

PATENT DOCUMENT 1: Japanese Patent Publication No. H08-145405

SUMMARY OF THE INVENTION

Technical Problem

Incidentally, in recent years, with advances in miniaturization of power modules, the heat density of a power module tends to increase. To address this problem, the cooling performance of the cooler may be enhanced, for example, by reducing the contact thermal resistance between the circular pipe and the heat transfer plate and the contact thermal resistance between the heat transfer plate and the power module, and thus, a power module having high heat density may be handled; however, the degree of enhancement of the cooling performance resulting from a reduction in each of the contact thermal resistances is limited, and thus, it may be impossible to address an increase in heat density due to further miniaturization of power modules in the future.

It is therefore an object of the present invention to provide a cooler with high cooling performance, and a refrigerating apparatus including the same.

Solution to the Problem

A first aspect of the invention is directed to a cooler including a circular pipe member (53) through which a heating medium circulates, and being in thermal contact with a heat generating component (80) to cool the heat generating component (80) with the heating medium flowing through the circular pipe member (53), and the cooler includes: a channel formation member (54) which axially extends through an interior of the circular pipe member (53), and between which and an inner circumferential surface of the circular pipe member (53) a narrow channel (C0) for the heating medium is formed.

In the first aspect of the invention, the axially extending channel formation member (54) is provided in the circular pipe member (53) of the cooler, and thus, the narrow channel (C0) for the heating medium is formed between the channel formation member (54) and the inner circumferential surface of the circular pipe member (53). The radial width of the narrow channel (C0) is smaller than that of a channel formed in the circular pipe member (53) when the channel formation member (54) is not provided by the radial length of the channel formation member (54). The heat generating component (80) is cooled by dissipating heat to the heating medium flowing through the narrow channel (C0) in the circular pipe member (53) of the cooler.

The heat transfer coefficient through the circular pipe is inversely proportional to the size of a cross section of the channel through the circular pipe. In other words, with decreasing width of the channel for the heating medium in a direction of the temperature gradient, the heat transfer coefficient is more significantly enhanced. Thus, as described above, the channel formation member (54) is disposed in the circular pipe member (53), and thus, the channel for the heating medium in the circular pipe member (53) is radially narrower than usual, thereby enhancing the heat transfer coefficient through the cooler.

According to a second aspect of the invention, in the first aspect of the invention, the channel formation member (54) may be disposed in the circular pipe member (53) such that the narrow channel (C0) forms an annular channel extending along the inner circumferential surface of the circular pipe member (53).

In the second aspect of the invention, the narrow channel (C0) forms an annular channel extending along the inner circumferential surface of the circular pipe member (53), and thus, the entire inner circumferential surface of the circular pipe member (53) forms a heat transfer surface.

According to a third aspect of the invention, the cooler of the second aspect of the invention may further include a plurality of partitioning walls (55) axially extending through the interior of the circular pipe member (53) and circumferentially dividing the narrow channel (C0).

In the third aspect of the invention, the annular narrow channel (C0) formed in the circular pipe member (53) is circumferentially divided by the plurality of partitioning walls (55). Thus, when the heating medium that has flowed into the circular pipe member (53) flows into the annular narrow channel (C0), it is diverted into division channels by the plurality of partitioning walls (55), and axially flows through the division channels. This provides a generally even flow of the heating medium through the narrow channel (C0) in a circumferential direction. In other words, an uneven flow of the heating medium through the annular narrow channel (C0) is reduced by the plurality of partitioning walls (55).

According to a fourth aspect of the invention, in the third aspect of the invention, an axially extending heat transfer plate (57) made of a metal may be provided between each adjacent pair of the partitioning walls (55) so as to be connected integrally to the circular pipe member (53).

In the fourth aspect of the invention, the heat transfer plate (57) made of the metal is provided between each adjacent pair of the partitioning walls (55) so as to be connected integrally to the circular pipe member (53), thereby significantly increasing the area where heat is transferred between the heating medium and the circular pipe member (53).

According to a fifth aspect of the invention, in the third or fourth aspect of the invention, a turbulent flow accelerator member (56) may be provided between each adjacent pair of the partitioning walls (55).

In the fifth aspect of the invention, the turbulent flow accelerator member (56) is provided between each adjacent pair of the partitioning walls (55), thereby accelerating a laminar-to-turbulent flow transition of the heating medium therebetween.

According to a sixth aspect of the invention, in the fifth aspect of the invention, the turbulent flow accelerator member (56) may include a plurality of protruding pieces (56a) connected integrally to the channel formation member (54) by injection-molding a resin.

In the sixth aspect of the invention, the plurality of protruding pieces (56a) forming the turbulent flow accelerator member (56) are connected integrally to the channel formation member (54) by injection-molding a resin, and thus, are easily formed.

According to a seventh aspect of the invention, in any one of the third through sixth aspects of the invention, the plurality of partitioning walls (55) may be connected integrally to the channel formation member (54) by injection-molding a resin.

In the seventh aspect of the invention, the plurality of partitioning walls (55) are connected integrally to the channel formation member (54) by injection-molding a resin, and thus, are easily formed.

According to an eighth aspect of the invention, in the second aspect of the invention, the heating medium may circumferentially flow through the narrow channel (C0).

In the eighth aspect of the invention, when the heating medium that has flowed into the circular pipe member (53) flows through one end of the channel formation member (54) into the narrow channel (C0), the direction in which the heating medium circulates is changed from the axial direction to the circumferential direction, and the heating medium flows through the radially narrow channel (C0) in the circumferential direction. Then, when the heating medium flows out of the narrow channel (C0) to the other end of the channel formation member (54), the direction in which the heating medium circulates is changed from the circumferential direction to the axial direction, and the heating medium flows out of the circular pipe member (53). When, as such, the heating medium flows through the narrow channel (C0) in the circumferential direction, the cross-sectional area of the channel (the area of a cross section of the narrow channel (C0) perpendicular to the direction in which the heating medium circulates) is larger than when the heating medium flows through the narrow channel (C0) in the axial direction. This reduces the velocity of flow of the heating medium through the narrow channel (C0), and reduces the channel length (the length of the channel along the direction in which the heating medium circulates), resulting in a reduction in pressure loss of the heating medium through the narrow channel (C0).

According to a ninth aspect of the invention, the cooler of the eighth aspect of the invention may further include: a plurality of partitioning walls (58) axially dividing the narrow channel (C0) in the circular pipe member (53) into a plurality of circumferentially extending division channels (C2). The channel formation member (54) may include an inlet side communication passage (P1, P2) providing communication between a heating medium inlet space (S1, S2) formed near one axial end of the channel formation member (54) and each of the division channels (C2), and an outlet side communication passage (P2, P1) providing communication between an outlet space (S2, S1) formed near the other axial end of the channel formation member (54) and each of the division channels (C2).

In the ninth aspect of the invention, the heating medium that has flowed into the inlet space (S1, S2) in the circular pipe member (53) flows through the inlet side communication passage (P1, P2) into the division channels (C2), circulates through the division channels (C2) in the circumferential direction, and then, flows through the outlet side communication passage (P2, P1) into the outlet space (S2, S1). In other words, the direction in which the heating medium flowing into the circular pipe member (53) circulates is changed from the axial direction to the circumferential direction by the plurality of partitioning walls (58), and the heating medium flows through the radially narrow division channels (C2) in the circumferential direction. When, as such, the radially narrow channel (C0) is axially divided into the plurality of circumferentially extending division channels (C2), the cross-sectional area of each of the division channels is larger than when the narrow channel (C0) is circumferentially divided into axially extending division channels. This reduces the velocity of flow of the heating medium through the division channels, and reduces the length of each of the division channels, resulting in a reduction in pressure loss of the heating medium through the division channel. An uneven flow of the heating medium through the annular narrow channel (C0) is reduced by the plurality of partitioning walls (58) to provide a generally even flow thereof in the axial direction.

According to a tenth aspect of the invention, in any one of the first through ninth aspects of the invention, the circular pipe member (53) may have a body portion (53a) in which the channel formation member (54) is provided, and connection portions (53b) which are continuous with axial ends of the body portion (53a) and are connected to a pipe through which the heating medium circulates, and the body portion (53a) may have a larger diameter than each of the connection portions (53b).

Incidentally, when, as described above, the channel formation member (54) is disposed in the circular pipe member (53), and the width of the channel formed in the circular pipe member (53) is reduced, this increases the velocity of flow of the heating medium, and increases the flow resistance of the heating medium, resulting in an increase in pressure loss.

However, in the tenth aspect of the invention, the body portion (53a) of the circular pipe member (53) in which the channel formation member (54) is disposed has a larger diameter than each of the connection portions (53b) which are continuous with the axial ends of the body portion (53a) and connected to the pipe through which the heating medium circulates. In other words, the body portion (53a) has a larger diameter than the pipe to which the circular pipe member (53) is connected. Thus, the cross-sectional area of the narrow channel (C0) formed in the circular pipe member (53) by the channel formation member (54) is larger than when the body portion (53a) has the same diameter as each of the connection portions (53b).

According to an eleventh aspect of the invention, in any one of the third through fifth aspect of the invention, the plurality of partitioning walls (55) may be made of a thermally conductive material, and connected integrally to the channel formation member (54) to form a spacer (59) defining a channel for the heating medium, and with the spacer (59) located in the circular pipe member (53), at least one of the circular pipe member (53) or the spacer (59) may be deformed to bring the circular pipe member (53) and the spacer (59) into contact with each other such that heat can be transferred between the circular pipe member (53) and the spacer (59), and to fix the circular pipe member (53) and the spacer (59) to each other.

In the eleventh aspect of the invention, the plurality of partitioning walls (55) are made of the thermally conductive material, and connected integrally to the channel formation member (54) to form the spacer (59), and at least one of the circular pipe member (53) or the spacer (59) is deformed, thereby allowing the spacer (59) to be in contact with the circular pipe member (53) such that heat can be transferred therebetween. Thus, both the circular pipe member (53) and the spacer (59) form heat dissipation members configured to dissipate heat of the heat generating component (80) to the heating medium flowing through the narrow channel (C0) in the circular pipe member (53). In other words, the area where heat is dissipated to the heating medium flowing through the narrow channel (C0) in the circular pipe member (53) is increased. The circular pipe member (53) and the spacer (59) are fixed to each other by deforming at least one of the circular pipe member (53) or the spacer (59) as described above.

According to a twelfth aspect of the invention, in the eleventh aspect of the invention, the channel formation member (54) may be formed in a hollow cylindrical shape, and with the spacer (59) located in the circular pipe member (53), the circular pipe member (53) and the spacer (59) may be both deformed by being pressed in a predetermined direction to be in contact with each other such that heat can be transferred between the circular pipe member (53) and the spacer (59), and to be fixed to each other.

In the twelfth aspect of the invention, with the spacer (59) located in the circular pipe member (53), the circular pipe member (53) and the spacer (59) are pressed to deform both of the circular pipe member (53) and the spacer (59). As a result, the circular pipe member (53) and the spacer (59) are in contact with each other such that heat can be transferred therebetween, and are fixed to each other. Furthermore, since the channel formation member (54) of the spacer (59) is formed in a hollow cylindrical shape, the spacer (59) is easily deformed.

Incidentally, when, as described above, the circular pipe member (53) and the spacer (59) are pressed in a predetermined direction so as to be deformed, the circular pipe member (53) and the spacer (59) are easily in contact with each other in the pressing direction in which they are pressed, and are, however, easily separated from each other in a direction orthogonal to the pressing direction; therefore, a large contact area cannot be ensured as a whole.

According to a thirteenth aspect of the invention, in the twelfth aspect of the invention, the circular pipe member (53) and the spacer (59) may be pressed such that a curvature of a portion of the circular pipe member (53) near the heat generating component (80) is larger than a curvature of a portion of the circular pipe member (53) opposite to the heat generating component (80).

In the thirteenth aspect of the invention, the circular pipe member (53) and the spacer (59) are pressed such that the curvature of the portion of the circular pipe member (53) near the heat generating component (80) is larger than that of the portion thereof opposite to the heat generating component (80), thereby entirely pressing the spacer (59) toward the heat generating component (80). This increases the area of contact between the portion of the circular pipe member (53) near the heat generating component (80) and a portion of the spacer (59) near the heat generating component (80).

According to a fourteenth aspect of the invention, in the twelfth aspect of the invention, the spacer (59) may be formed such that a rigidity of a portion of the spacer (59) near the heat generating component (80) is lower than a rigidity of a portion of the spacer (59) opposite to the heat generating component (80).

In the fourteenth aspect of the invention, when, with the spacer (59) located in the circular pipe member (53), the circular pipe member (53) and the spacer (59) are pressed in a predetermined direction, the spacer (59) is entirely pressed toward the heat generating component (80), because the portion of the spacer (59) near the heat generating component (80) has lower rigidity than the portion thereof opposite to the heat generating component (80). This increases the area of contact between the portion of the circular pipe member (53) near the heat generating component (80) and the portion of the spacer (59) near the heat generating component (80).

According to a fifteenth aspect of the invention, in the fourteenth aspect of the invention, a portion (54b) of the channel formation member (54) near the heat generating component (80) may be thinner than a portion (54a) of the channel formation member (54) opposite to the heat generating component (80).

In the fifteenth aspect of the invention, the portion (54b) of the hollow cylindrical channel formation member (54) near the heat generating component (80) is thinner than the portion (54a) thereof opposite to the heat generating component (80). This allows the rigidity of the portion of the spacer (59) near the heat generating component (80) to be lower than that of the portion thereof opposite to the heat generating component (80).

According to a sixteenth aspect of the invention, in the twelfth aspect of the invention, the spacer (59) may be formed such that a cross-sectional area of one, near the heat generating component (80), of a plurality of axial channels (C1) into which the narrow channel (C0) is circumferentially divided by the plurality of partitioning walls (55) is larger than a cross-sectional area of one of the axial channels (C1) opposite to the heat generating component (80).

In the sixteenth aspect of the invention, the cross-sectional area of one, near the heat generating component (80), of the plurality of axial channels (C1) into which the narrow channel (C0) is circumferentially divided by the plurality of partitioning walls (55) is larger than that of one of the axial channels (C1) opposite to the heat generating component (80). This allows a large amount of the heating medium to flow through a portion of the narrow channel (C0) near the heat generating component (80).

According to a seventeenth aspect of the invention, the cooler of any one of the first through sixteenth aspects of the invention may further include: a heat transfer member (52) having a recess (52d) into which the circular pipe member (53) is fitted, and a mounting surface (52c) on which a heat dissipation surface of the heat generating component (80) is placed, and configured to transfer heat absorbed by the mounting surface (52c) to the recess (52d).

According to an eighteenth aspect of the invention, in the seventeenth aspect of the invention, the recess (52d) may be formed in a surface of the heat transfer member (52) opposite to the mounting surface (52c) at a location corresponding to the heat generating component (80) mounted on the mounting surface (52c).

In the seventeenth and eighteenth aspects of the invention, the cooler includes the heat transfer member (52) having the recess (52d) into which the circular pipe member (53) is fitted, and the mounting surface (52c) on which the heat dissipation surface of the heat generating component (80) is placed, and configured to transfer heat absorbed by the mounting surface (52c) to the recess (52d). Therefore, the heat generating component (80) and the circular pipe member (53) are mounted to the heat transfer member (52), thereby facilitating heat exchange between the heat generating component (80) and the heating medium in the circular pipe member (53). As a result, heat generated in the heat generating component (80) is efficiently absorbed through the heat transfer member (52) by the heating medium in the circular pipe member (53).

In particular, in the eighteenth aspect of the invention, the recess (52d) is formed in the surface of the heat transfer member (52) opposite to the mounting surface (52c) at a location corresponding to the heat generating component (80) mounted on the mounting surface (52c). In other words, the heat generating component (80) and the circular pipe member (53) are located on the front and back surfaces, respectively, of the heat transfer member (52) to correspond to each other. This allows the path of heat from the heat generating component (80) through the heat transfer member (52) to the circular pipe member (53) to be shorter than when the heat generating component (80) and the circular pipe member (53) are disposed at locations which do not correspond to each other, resulting in a reduction in thermal resistance between the heat generating component (80) and the circular pipe member (53).

According to a nineteenth aspect of the invention, in the seventeenth or eighteenth aspect of the invention, the circular pipe member (53) may be one straight pipe member.

Incidentally, when a U-shaped pipe is used as the circular pipe member (53), and two straight pipe portions of the U-shaped pipe are fitted into two recesses (52d) of the heat transfer member (52), the pressure of one of the straight pipe portions against the inner surface of a corresponding one of the recesses (52d) may cause the contact between the other straight pipe portion and the inner surface of the other recess (52d) to be poor depending on the manner in which the U-shaped pipe is finished, and the heat transfer performance may be decreased.

However, in the nineteenth aspect of the invention, the circular pipe member (53) is one straight pipe member. Therefore, the circular pipe member (53) and the inner surface of the recess (52d) are brought into contact with each other simply by fitting the circular pipe member (53) into the recess (52d) and pressing it against the inner surface of the recess (52d).

A twentieth aspect of the invention is directed to a refrigerating apparatus including: a refrigerant circuit (20) through which a refrigerant circulates to perform a vapor compression refrigeration cycle, wherein the cooler of any one of the first through nineteenth aspects of the invention is connected to a liquid pipe of the refrigerant circuit (20).

In the twentieth aspect of the invention, a liquid refrigerant circulating through a liquid pipe of the refrigerant circuit (20) circulates, as the heating medium, through the circular pipe member (53) of the cooler. In the cooler, the heat generating component is cooled with the liquid refrigerant flowing through the circular pipe member (53).

Advantages of the Invention

According to the first aspect of the invention, the radially narrow channel (C0) for the heating medium is formed in the circular pipe member (53) by the channel formation member (54), thereby allowing the heat transfer coefficient through the cooler to be higher than when the channel formation member (54) is not provided. This can provide a cooler with high cooling performance, and a heat generating component having high heat density can be sufficiently cooled by the cooler.

According to the second aspect of the invention, the channel formation member (54) is disposed such that the narrow channel (C0) formed in the circular pipe member (53) by the channel formation member (54) forms an annular channel extending along the inner circumferential surface of the circular pipe member (53), and thus, the entire inner circumferential surface of the circular pipe member (53) can be formed as a heat transfer surface. As above, the area where heat is transferred between the heating medium and the circular pipe member (53) is increased to a maximum area, thereby further enhancing the cooling performance of the cooler.

According to the third aspect of the invention, the annular narrow channel (C0) formed in the circular pipe member (53) by the channel formation member (54) is circumferentially divided by the plurality of partitioning walls (55), thereby reducing an uneven flow of the heating medium through the annular narrow channel (C0). When the heating medium unevenly flows through the annular narrow channel (C0), this flow significantly reduces the efficiency of heat transfer. Therefore, as described above, the uneven flow of the heating medium through the annular narrow channel (C0) is reduced, thereby enhancing the cooling performance of the cooler.

According to the fourth aspect of the invention, the heat transfer plate (57) made of a metal is provided between each adjacent pair of the partitioning walls (55) so as to be connected integrally to the circular pipe member (53), and thus, the area where heat is transferred between the heating medium and the circular pipe member (53) can be significantly increased. This can further enhance the cooling performance of the cooler.

According to the fifth aspect of the invention, the turbulent flow accelerator member (56) accelerates the laminar-to-turbulent flow transition of the heating medium between each adjacent pair of the partitioning walls (55). This enhances the heat transfer coefficient between the heating medium and the circular pipe member (53). Consequently, the cooling performance of the cooler can be further enhanced.

According to the sixth aspect of the invention, the turbulent flow accelerator member (56) can be easily formed.

According to the seventh aspect of the invention, the plurality of partitioning walls (55) can be easily formed.

According to the eighth aspect of the invention, the heating medium circumferentially flows through the radially narrow channel (C0), and thus, the pressure loss of the heating medium through the narrow channel (C0) can be lower than when the heating medium axially flows through the narrow channel (C0).

According to the ninth aspect of the invention, the radially narrow channel (C0) is axially divided into the plurality of circumferentially extending division channels (C2), and thus, the pressure loss of the heating medium through each of the division channels (C2) can be lower than when the narrow channel (C0) is circumferentially divided into a plurality of axially extending division channels. Furthermore, the annular narrow channel (C0) formed in the circular pipe member (53) is axially divided by the plurality of partitioning walls (55), thereby reducing an uneven flow of the heating medium through the annular narrow channel (C0). Here, when the heating medium unevenly flows through the annular narrow channel (C0), this flow significantly reduces the efficiency of heat transfer. Therefore, as described above, the uneven flow of the heating medium through the annular narrow channel (C0) is reduced to provide a generally even flow of the heating medium in the axial direction, thereby enhancing the cooling performance of the cooler.

According to the tenth aspect of the invention, the body portion (53a) of the circular pipe member (53) has a larger diameter than the pipe to which the circular pipe member (53) is connected, thereby reducing a reduction in the cross-sectional area of the narrow channel (C0) for the heating medium due to provision of the channel formation member (54) in the circular pipe member (53). This can reduce an increase in the pressure loss of the heating medium due to provision of the channel formation member (54) in the circular pipe member (53).

According to the eleventh aspect of the invention, the plurality of partitioning walls (55) and the channel formation member (54) are made of the thermally conductive material, and integrally connected together to form the spacer (59), and at least one of the circular pipe member (53) or the spacer (59) is deformed to bring the spacer (59) into contact with the circular pipe member (53) such that heat can be transferred therebetween. Thus, both the circular pipe member (53) and the spacer (59) can form heat dissipation members configured to dissipate heat of the heat generating component (80) to the heating medium flowing through the narrow channel (C0) in the circular pipe member (53). This can increase the area where heat is dissipated to the heating medium flowing through the narrow channel (C0) in the circular pipe member (53), thereby enhancing the cooling performance of the cooler.

Furthermore, according to the eleventh aspect of the invention, at least one of the circular pipe member (53) or the spacer (59) is deformed so as to be fixed to each other; therefore, the circular pipe member (53) and the spacer (59) can be easily fixed to each other without providing a fixture having a complicated structure.

According to the twelfth aspect of the invention, with the spacer (59) located in the circular pipe member (53), the circular pipe member (53) and the spacer (59) are pressed in a predetermined direction; therefore, the circular pipe member (53) and the spacer (59) can be easily brought into contact with each other such that heat can be transferred therebetween, and can be easily fixed to each other.

According to the thirteenth aspect of the invention, the circular pipe member (53) and the spacer (59) are pressed such that the curvature of the portion of the circular pipe member (53) near the heat generating component (80) is larger than that of the portion of the circular pipe member (53) opposite to the heat generating component (80), and the spacer (59) is entirely pressed toward the heat generating component (80), thereby increasing the area of contact between the portion of the circular pipe member (53) near the heat generating component (80) and the portion of the spacer (59) near the heat generating component (80). This can increase the area where heat is dissipated to the heating medium flowing through a portion of the narrow channel (C0) near the heat generating component (80) in the circular pipe member (53), thereby enhancing the cooling performance. Therefore, the heat generating component (80) can be efficiently cooled.

According to the fourteenth aspect of the invention, the spacer (59) is formed such that the rigidity of the portion of the circular pipe member (53) near the heat generating component (80) is lower than that of the portion of the circular pipe member (53) opposite to the heat generating component (80); therefore, when the circular pipe member (53) and the spacer (59) are pressed, the spacer (59) is entirely pressed toward the heat generating component (80). This can increase the area of contact between the portion of the circular pipe member (53) near the heat generating component (80) and the portion of the spacer (59) near the heat generating component (80). This can increase the area where heat is dissipated to the heating medium flowing through a portion of the narrow channel (C0) near the heat generating component (80) in the circular pipe member (53), thereby enhancing the cooling performance. Therefore, the heat generating component (80) can be efficiently cooled.

According to the fifteenth aspect of the invention, with a simple configuration, the spacer (59) can be formed such that the rigidity of the portion of the spacer (59) near the heat generating component (80) is lower than that of the portion thereof opposite to the heat generating component (80).

According to the sixteenth aspect of the invention, the spacer (59) is formed such that the cross-sectional area of one of the plurality of axial channels (C1) near the heat generating component (80) is larger than that of one of the axial channels (C1) opposite to the heat generating component (80), thereby allowing a large amount of the heating medium to circulate through a portion of the narrow channel (C0) near the heat generating component (80) and enhancing the cooling performance of a portion of the cooler near the heat generating component (80). Therefore, the heat generating component (80) can be efficiently cooled.

According to the seventeenth and eighteenth aspects of the invention, the heat generating component (80) and the circular pipe member (53) are mounted to the heat transfer member (52) having the recess (52d) into which the circular pipe member (53) is fitted, and the mounting surface (52c) on which the heat dissipation surface of the heat generating component (80) is placed, and configured to transfer heat absorbed by the mounting surface (52c) to the recess (52d), thereby facilitating heat exchange between the heat generating component (80) and the heating medium in the circular pipe member (53). Therefore, heat generated in the heat generating component (80) can be efficiently absorbed through the heat transfer member (52) by the heating medium in the circular pipe member (53), and the heat generating component (80) can be efficiently cooled.

In particular, according to the eighteenth aspect of the invention, the recess (52d) is formed in the surface of the heat transfer member (52) opposite to the mounting surface (52c) at a location corresponding to the heat generating component (80) mounted on the mounting surface (52c), and thus, the heat generating component (80) and the circular pipe member (53) are located on the front and back surfaces, respectively, of the heat transfer member (52) to correspond to each other. This allows the path of heat from the heat generating component (80) through the heat transfer member (52) to the circular pipe member (53) to be shorter than when the heat generating component (80) and the circular pipe member (53) are disposed at locations which do not correspond to each other. This can reduce the thermal resistance between the heat generating component (80) and the circular pipe member (53). Therefore, the cooling performance of the cooler can be further enhanced.

According to the nineteenth aspect of the invention, the circular pipe member (53) and the inner surface of the recess (52d) can be easily brought into contact with each other without the influence of the other members. This can easily reduce the contact thermal resistance between the circular pipe member (53) and the heat transfer member (52), thereby easily enhancing the cooling performance of the cooler.

According to the twentieth aspect of the invention, the cooler is connected to the liquid pipe of the refrigerant circuit (20), thereby sufficiently cooling a heat generating component having high heat density with a liquid refrigerant through the refrigerant circuit (20).

BRIEF DESCRIPTION OF THE DRAWINGS

FIG. 6 is a cross-sectional view of a cooler according to a third embodiment.

FIG. 7(A) is a diagram illustrating an internal structure of a cooler body from which a portion of a circular pipe member is removed according to a fourth embodiment, and FIG. 7(B) is a longitudinal cross-sectional view of the cooler body according to the fourth embodiment.

FIG. 12(A) is a longitudinal cross-sectional view of a cooler body according to a seventh embodiment, and FIG. 12(B) is an enlarged view of how a fixing structure is deformed.

FIGS. 16(A) and 16(B) are operation diagrams where a circular pipe member of a cooler body and a spacer according to the ninth embodiment are pressed.

FIGS. 18(A) and 18(B) are operation diagrams where a circular pipe member of a cooler body and a spacer according to an eleventh embodiment are pressed.

FIGS. 19(A) and 19(B) are operation diagrams where a circular pipe member of a cooler body and a spacer according to a twelfth embodiment are pressed.

FIGS. 20(A) and 20(B) are operation diagrams where a circular pipe member of a cooler body and a spacer according to a thirteenth embodiment are pressed.

FIGS. 21(A) and 21(B) are operation diagrams where a circular pipe member of a cooler body and a spacer according to a fourteenth embodiment are pressed.

DESCRIPTION OF EMBODIMENTS

A cooler and a refrigerating apparatus including the same according to each of embodiments of the present invention will be described hereinafter with reference to the drawings. Although an air conditioner will be described hereinafter as an example refrigerating apparatus according to the present invention, the refrigerating apparatus according to the present invention is not limited to the air conditioner.

<<First Embodiment of the Invention>>

Figure 1:
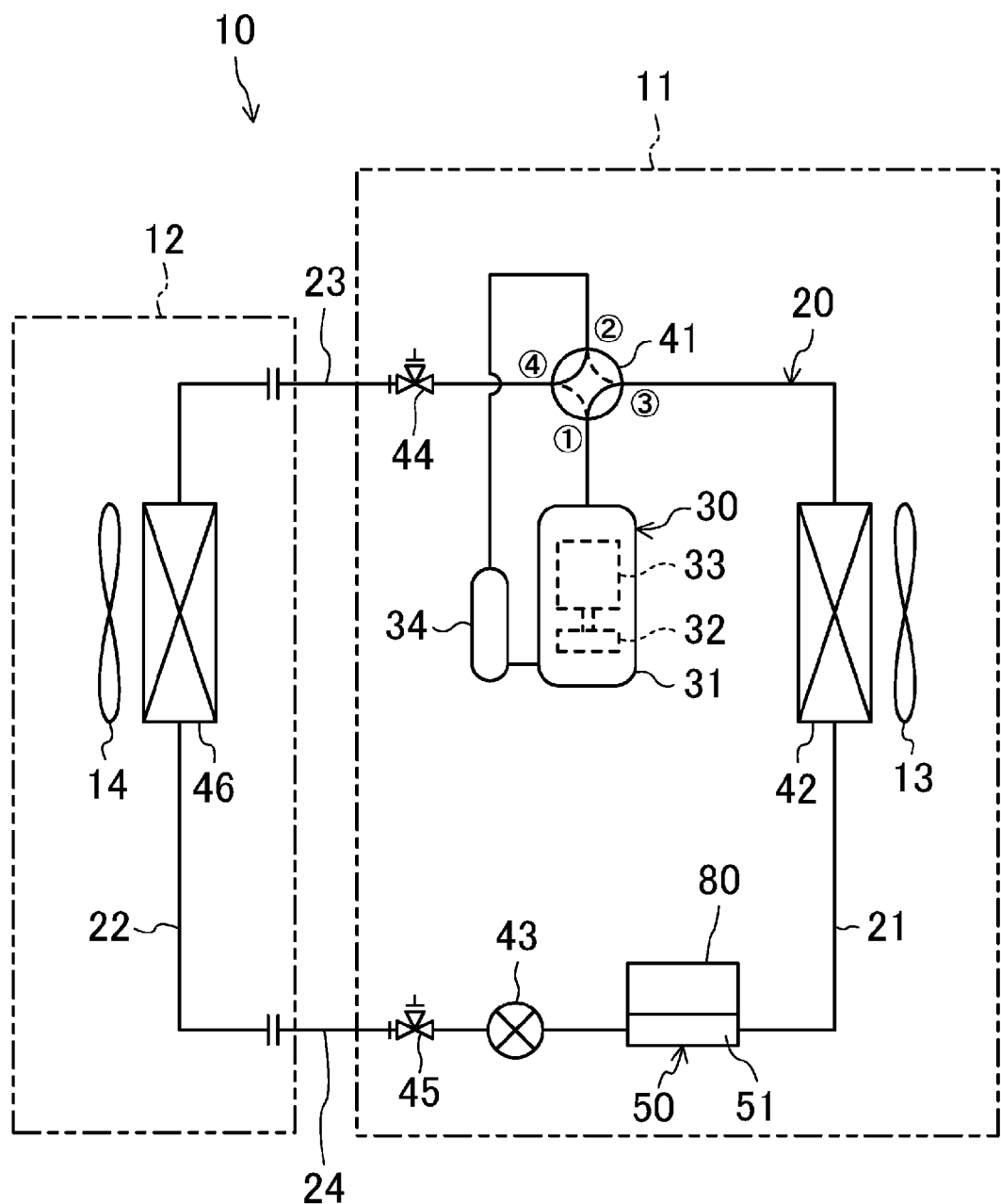
FIG. 1 is a refrigerant circuit diagram illustrating a schematic configuration of an air conditioner according to a first embodiment of the present invention.

As illustrated in FIG. 1, an air conditioner (10) of a first embodiment includes an outdoor unit (11) that is installed outdoors, and an indoor unit (12) that is installed indoors. An outdoor circuit (21) is accommodated in the outdoor unit (11). An indoor circuit (22) is accommodated in the indoor unit (12). In this air conditioner (10), the outdoor circuit (21) is connected to the indoor circuit (22) through a pair of connecting pipes (23, 24) to form a refrigerant circuit (20).

The outdoor circuit (21) is provided with a compressor (30), a four-way switching valve (41), an outdoor heat exchanger (42), a cooler (50), and an expansion valve (43). A power module (80) for a power supply system (not shown) configured to supply power to, e.g., the compressor (30) is mounted on the cooler (50). The configuration of the cooler (50) will be described below in detail.

In the outdoor circuit (21), the compressor (30) has its discharge side connected to a first port of the four-way switching valve (41), and its suction side connected to a second port of the four-way switching valve (41) via an accumulator (34). The four-way switching valve (41) has its third port connected to one end of the outdoor heat exchanger (42), and its fourth port connected to a gas-side stop valve (44). The other end of the outdoor heat exchanger (42) is connected to one end of the expansion valve (43) via the cooler (50). The other end of the expansion valve (43) is connected to a liquid-side stop valve (45).

The indoor circuit (22) is provided with an indoor heat exchanger (46). The indoor circuit (22) has its gas-side end connected to the gas-side stop valve (44) via the gas-side connecting pipe (23), and its liquid-side end connected to the liquid-side stop valve (45) via the liquid-side connecting pipe (24).

The compressor (30) is a so-called hermetic compressor. That is, in the compressor (30), a compression mechanism (32) configured to compress a refrigerant and an electric motor (33) configured to rotationally drive the compression mechanism (32) are accommodated in a single casing (31). The four-way switching valve (41) is switched between a first state (the state shown by the solid line in FIG. 1) where the first port communicates with the third port and the second port communicates with the fourth port, and a second state (the state shown by the broken line in FIG. 1) where the first port communicates with the fourth port and the second port communicates with the third port. The expansion valve (43) is an electric expansion valve having a valve body driven by a pulse motor and having a degree of opening which can be varied.

The outdoor heat exchanger (42) is a fin-and-tube heat exchanger, and causes the refrigerant to exchange heat with outdoor air. An outdoor fan (13) configured to blow outdoor air to the outdoor heat exchanger (42) is disposed in the vicinity of the outdoor heat exchanger (42) of the outdoor unit (11).

The indoor heat exchanger (46) is a fin-and-tube heat exchanger, and causes the refrigerant to exchange heat with indoor air. An indoor fan (14) configured to blow indoor air to the indoor heat exchanger (46) is disposed in the vicinity of the indoor heat exchanger (46) of the indoor unit (12).

The indoor unit (11) is provided with a power supply system (not shown) configured to supply power to a device, such as the compressor (30). The power supply system is provided with a power module (80), such as an insulated gate bipolar transistor (IGBT) or a diode. The cooler (50) described above is installed on the power module (80).

<Cooler>

Figure 2:
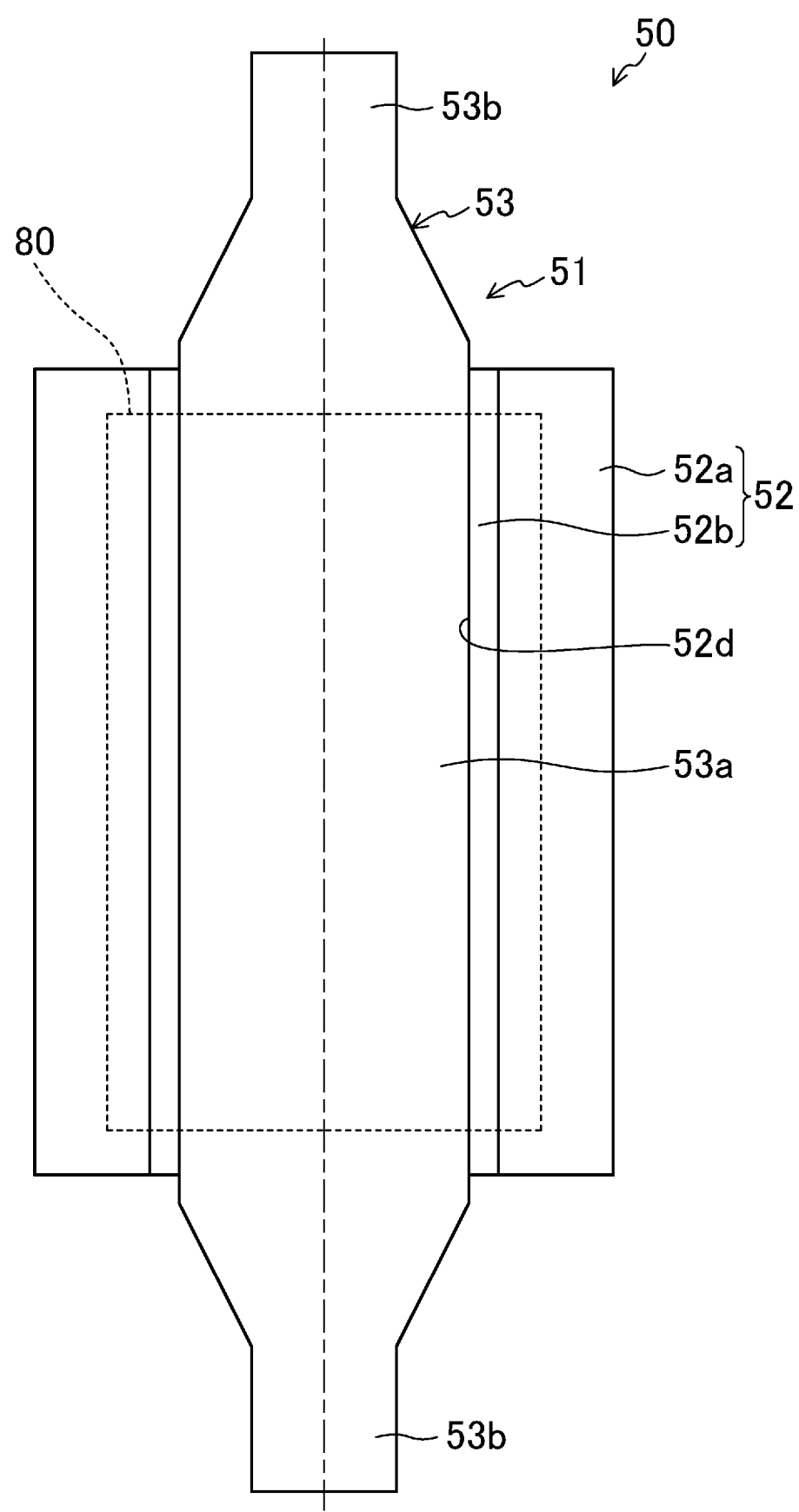
FIG. 2 is a plan view of a cooler according to the first embodiment.
Figure 3:
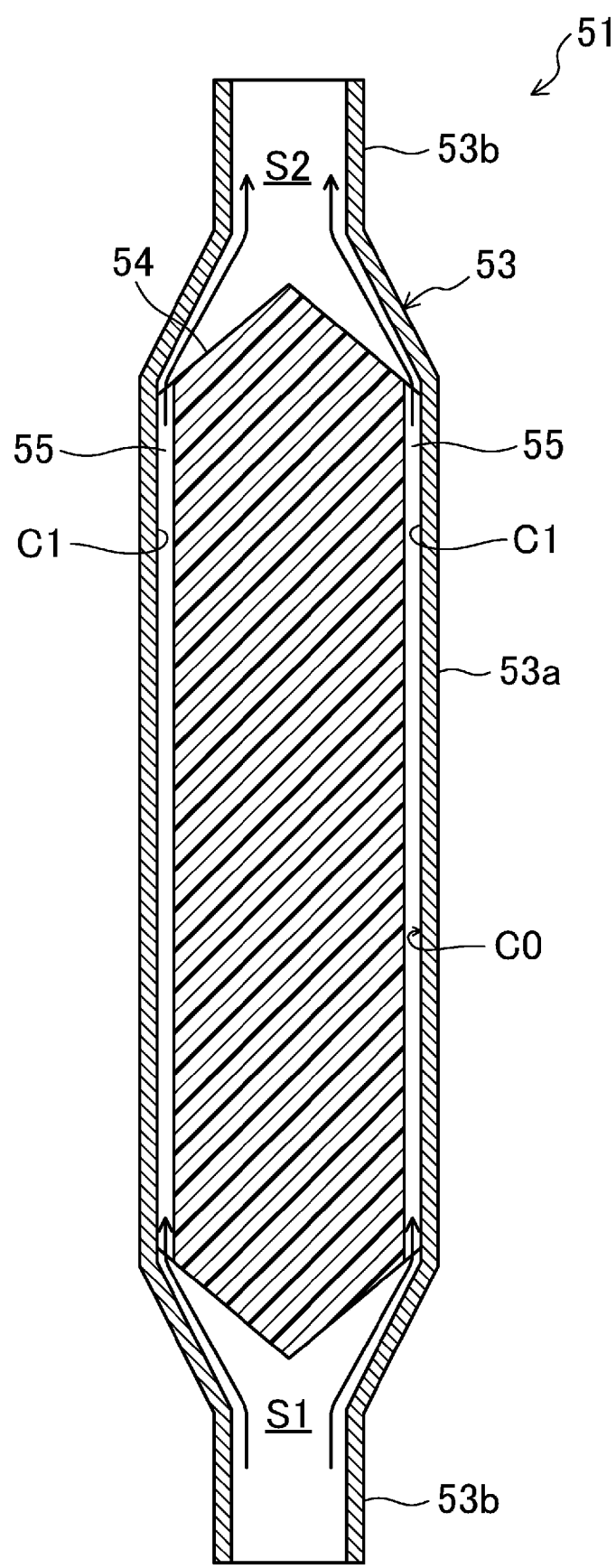
FIG. 3 is a longitudinal cross-sectional view of a cooler body according to the first embodiment.
Figure 4:
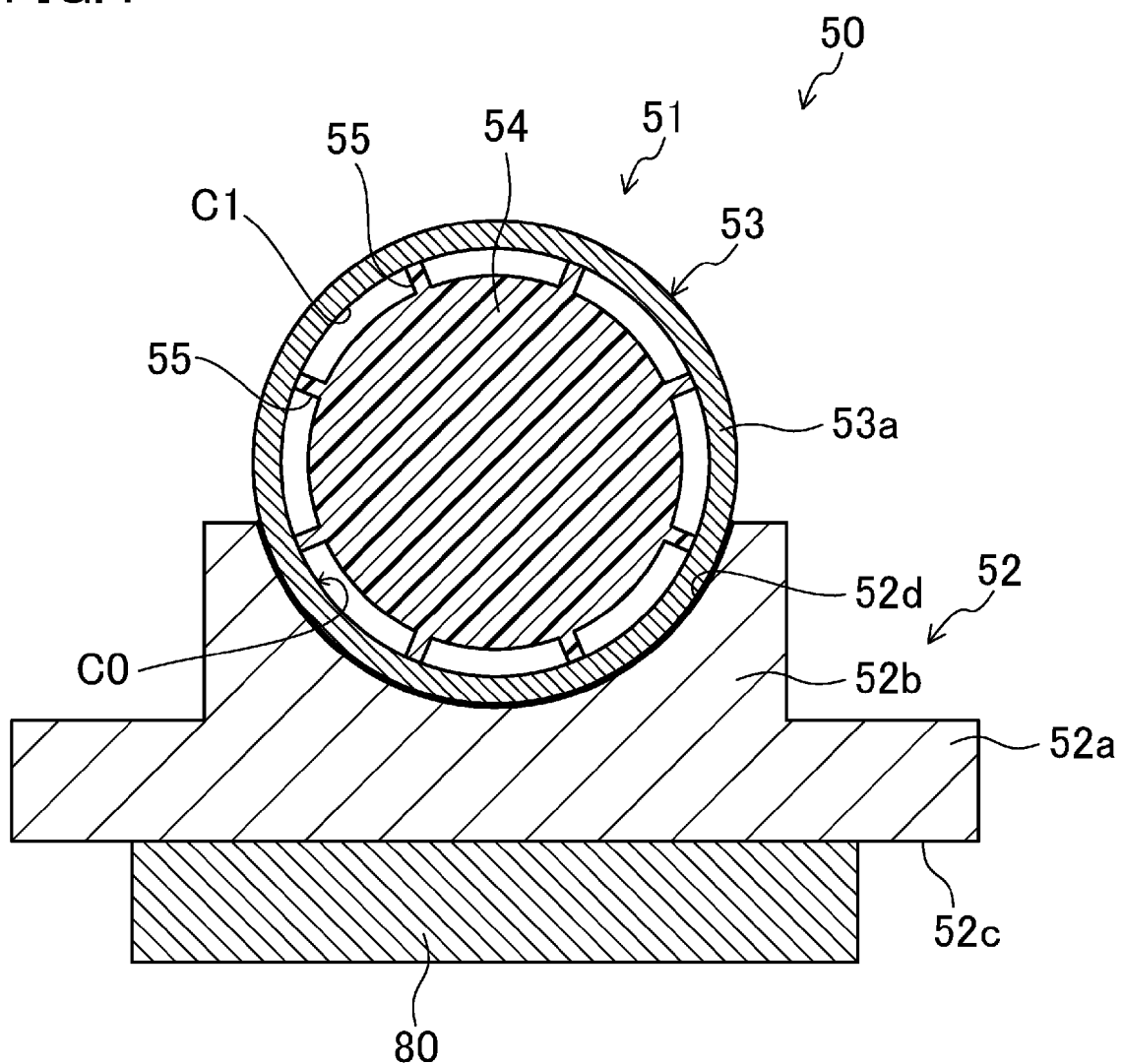
FIG. 4 is a cross-sectional view of the cooler and a power module according to the first embodiment.

As illustrated in FIGS. 2-4, the cooler (50) includes a cooler body (51) and a heat transfer member (52).

The cooler body (51) includes a circular pipe member (53), a channel formation member (54) which is provided in the circular pipe member (53), and between which and the inner circumferential surface of the circular pipe member (53) a narrow channel (C0) is formed, and partitioning walls (55) circumferentially dividing the narrow channel (C0) formed by the channel formation member (54) into a plurality of sub-channels.

The circular pipe member (53) is a single straight pipe member. The circular pipe member (53) has a body portion (53a), and connection portions (53b) disposed at both ends of the body portion (53a). The connection portions (53b) are connected to a refrigerant pipe forming the refrigerant circuit (20), thereby allowing the circular pipe member (53) to form a portion of the refrigerant circuit (20). The body portion (53a) has a larger diameter than each of the connection portions (53b). The connection portions (53b) each have substantially the same diameter as that of the refrigerant pipe of the refrigerant circuit (20) to which the circular pipe member (53) is connected. That is, the body portion (53a) has a larger diameter than the refrigerant pipe of the refrigerant circuit (20) to which the circular pipe member (53) is connected. Although described below in detail, the connection portions (53b) of the circular pipe member (53) are formed by placing the channel formation member (54) and the partitioning walls (55) in the straight pipe member made of a copper pipe, and subsequently drawing both axial end portions of the straight pipe member. The connection portions (53b) each having a smaller diameter than the body portion (53a) may be first formed, and then, may be brazed to the body portion (53a).

The channel formation member (54) is formed in the shape of a solid cylinder having a slightly smaller diameter than the body portion (53a) of the circular pipe member (53), and both axial end portions of the channel formation member (54) are tapered. As illustrated in FIG. 4, the channel formation member (54) is disposed such that its axis coincides with the axis of the circular pipe member (53). When the channel formation member (54) is placed as above, the annular narrow channel (C0) which is radially narrow is formed between the outer circumferential surface of the channel formation member (54) and the inner circumferential surface of the body portion (53a) of the circular pipe member (53).

The partitioning walls (55) are each made of a plate-like member radially extending from the channel formation member (54). In the first embodiment, the number of the partitioning walls (55) is eight, and the narrow channel (C0) is circumferentially divided into eight sub-channels forming eight axially extending axial channels (C1). In the first embodiment, the eight partitioning walls (55) are connected integrally to the channel formation member (54) by injection-molding a resin. A structure including the channel formation member (54) and the partitioning walls (55) which are integrally connected together has an outside diameter that is slightly larger than the inside diameter of the body portion (53a) of the circular pipe member (53), and is fixed by being press-fitted into the body portion (53a).

With such a configuration as described above, as illustrated in FIG. 3, while a first space (S1) is formed in a portion of the circular pipe member (53) of the cooler body (51) toward one axial end of the channel formation member (54) by the channel formation member (54), a second space (S2) is formed in a portion of the circular pipe member (53) toward the other axial end thereof. The eight axial channels (C1) are formed between the first and second spaces (S1) and (S2) in the circular pipe member (53) by the channel formation member (54) and the eight axially extending partitioning walls (55). In the first embodiment, one of the connection portions (53b) of the circular pipe member (53) of the cooler body (51) near the first space (S1) is connected through a portion of the refrigerant pipe to the outdoor heat exchanger (42), and the other connection portion (53b) near the second space (S2) is connected through a portion of the refrigerant pipe to the expansion valve (43).

The heat transfer member (52) is made of a metal material with high thermal conductivity, such as aluminum. The heat transfer member (52) has a plate-like portion (52a) on which the power module (80) is fixed, and a holding portion (52b) which protrudes from a surface of the plate-like portion (52a) and on which the circular pipe member (53) of the cooler body (51) is fixed.

A surface of the plate-like portion (52a) opposite to the holding portion (52b) forms a mounting surface (52c) on which a heat dissipation surface of the power module (80) is placed. The power module (80) is disposed such that its heat dissipation surface is in contact with the mounting surface (52c) via, e.g., thermally conductive grease, and is fixed to the heat transfer member (52) with a screw. Although not shown, the power module (80) has an insulating substrate having a surface on which a plurality of power semiconductor chips are mounted, and a heatsink made of a metal plate is placed on a surface of the insulating substrate opposite to the surface on which the power semiconductor chips are mounted. A surface of the heatsink opposite to the insulating substrate forms the heat dissipation surface of the power module (80).

A recess (52d) into which the circular pipe member (53) is fitted is formed in the holding portion (52b). As illustrated in FIG. 4, the recess (52d) is formed in the form of a segment of a circle into which the circular pipe member (53) can be fitted when viewed in cross section. The recess (52d) is formed in a surface of the heat transfer member (52) opposite to the mounting surface (52c) at a location corresponding to the power module (80) mounted on the mounting surface (52c). A portion of the outer circumferential surface of the circular pipe member (53) is in contact with the wall of the recess (52d) via, e.g., thermally conductive grease, and is pressed into the recess (52d) with an unshown pressing member. The pressing member is disposed on a portion of the circular pipe member (53) opposite to the heat transfer member (52), and is fixed to the heat transfer member (52) via a screw, thereby pressing the circular pipe member (53) into the recess (52d). With such a configuration, the circular pipe member (53) can be removed. The circular pipe member (53) may be fixed to the heat transfer member (52) with an adhesive or by brazing.

With such a configuration as described above, the circular pipe member (53) of the single cooler body (51) and the single power module (80) are mounted to the heat transfer member (52) so as to be opposed to each other with the heat transfer member (52) interposed therebetween. That is, the cooler body (51) is located immediately above the power module (80) mounted on the mounting surface (52c) of the heat transfer member (52). This location allows the heat path from the power module (80) through the heat transfer member (52) to the circular pipe member (53) to be shorter than when the circular pipe member (53) and the power module (80) are not aligned, thereby reducing the thermal resistance between the power module (80) and the cooler body (51).

—Operational Behavior—

Next, the operational behavior of the air conditioner (10) of this embodiment will be described. The air conditioner (10) of the first embodiment selectively performs a cooling operation and a heating operation.

<Cooling Operation>

During the cooling operation, in the air conditioner (10), the four-way switching valve (41) is switched to the first state (the state shown by the solid line in FIG. 1), and the outdoor fan (13) and the indoor fan (14) are operated. During the cooling operation, a refrigeration cycle is performed in the refrigerant circuit (20) so that the outdoor heat exchanger (42) serves as a condenser and the indoor heat exchanger (46) serves as an evaporator.

During the cooling operation, in the refrigerant circuit (20), the refrigerant discharged from the compressor (30) flows into the outdoor heat exchanger (42) through the four-way switching valve (41), dissipates heat to the outdoor air, and condenses in the outdoor heat exchanger (42). The condensed refrigerant flows into the cooler body (51) of the cooler (50).

The refrigerant that has flowed into the cooler body (51) initially flows into the first space (S1) of the circular pipe member (53). Then, the refrigerant that has flowed into the first space (S1) flows through an annular channel formed between an end portion of the channel formation member (54) near the first space (S1) and the inner circumferential surface of the circular pipe member (53), and flows into the eight axial channels (C1). Since the end portion of the channel formation member (54) near the first space (S1) is tapered, the width of the annular channel decreases downstream, and a downstream end portion of the annular channel forms a narrow channel having substantially the same width as the radial width of each of the eight axial channels (C1). The refrigerant through the annular channel flows into the eight axial channels (C1), and axially flows through the axial channels (C1), and the refrigerant that has flowed therethrough joins into the second space (S2), and flows out of the cooler body (51).

The refrigerant that has flown out of the cooler body (51) of the cooler (50) is decompressed when flowing through the expansion valve (43), and then flows into the indoor heat exchanger (46). In the indoor heat exchanger (46), the refrigerant absorbs heat from the indoor air and evaporates, resulting in the indoor air cooled. The evaporated refrigerant sequentially flows through the four-way switching valve (41) and the accumulator (34), and then is suctioned into the compressor (30) and compressed therein.

<Heating Operation>

During the heating operation, in the air conditioner (10), the four-way switching valve (41) is switched to the second state (the state shown by the broken line in FIG. 1), and the outdoor fan (13) and the indoor fan (14) are operated. During the heating operation, a refrigeration cycle is performed in the refrigerant circuit (20) so that the indoor heat exchanger (46) serves as a condenser and the outdoor heat exchanger (42) serves as an evaporator. During the heating operation, the cooler (50) is located between the expansion valve (43) and the outdoor heat exchanger (42) serving as the evaporator in the refrigerant circuit (20).

During the heating operation, in the refrigerant circuit (20), the refrigerant discharged from the compressor (30) flows into the indoor heat exchanger (46) through the four-way switching valve (41). In the indoor heat exchanger (46), the refrigerant dissipates heat to the indoor air and condenses. As a result, the indoor air is heated. The refrigerant that has condensed in the indoor heat exchanger (46) is decompressed when flowing through the expansion valve (43), and then flows into the cooler body (51) of the cooler (50).

The refrigerant that has flowed into the cooler body (51) initially flows into the second space (S2) of the circular pipe member (53). Then, the refrigerant that has flowed into the second space (S2) flows through an annular channel formed between an end portion of the channel formation member (54) near the second space (S2) and the inner circumferential surface of the circular pipe member (53), and flows into the eight axial channels (C1). Since the end portion of the channel formation member (54) near the second space (S2) is tapered, the radial width of the annular channel decreases downstream, and a downstream end portion of the annular channel forms a narrow channel having substantially the same width as the radial width of each of the eight axial channels (C1). The refrigerant through the annular channel flows into the eight axial channels (C1), and axially flows through the axial channels (C1), and the refrigerant that has flowed therethrough joins into the first space (S1), and flows out of the cooler body (51).

The refrigerant that has flown out of the cooler body (51) of the cooler (50) flows into the outdoor heat exchanger (42), absorbs heat from the outdoor air, and evaporates. The refrigerant that has evaporated in the outdoor heat exchanger (42) sequentially flows through the four-way switching valve (41) and the accumulator (34), and then is suctioned into the compressor (30) and compressed therein.

<Cooling of Power Module>

In the air conditioner (10), the power module (80) of the power supply system (supply system) generates heat when a current is applied thereto. Here, as described above, during the cooling operation, the refrigerant that has condensed in the outdoor heat exchanger (42) flows through the cooler body (51) of the cooler (50), and during the heating operation, the refrigerant that has been decompressed by the expansion valve (43) flows therethrough. The temperature of the refrigerant flowing through the circular pipe member (53) of the cooler body (51) of the cooler (50) is lower than that of the operating power module (80). Therefore, the heat of the power module (80) is absorbed through the heat transfer member (52) and the circular pipe member (53) by the refrigerant flowing through the circular pipe member (53). This enables the cooling of the power module (80), thereby reducing an increase in temperature of the power module (80).

Since, in the cooler (50), the radially narrow channel (C0) is formed in the circular pipe member (53) by the channel formation member (54), this more significantly enhances the heat transfer coefficient than when a usual circular pipe is used, thereby efficiently cooling the power module (80).

—Assembly of Cooler Body—

The channel formation member (54) to which the partitioning walls (55) are integrally connected is press-fitted into the straight pipe member forming the circular pipe member (53) (press-fitting step). In a later process step, a middle portion of the straight pipe member will be a body portion (53a), and both end portions thereof will be connection portions (53b) each having a smaller diameter than the body portion (53a); however, in this press-fitting step, the straight pipe member is not sectioned into the body portion (53a) and the connection portions (53b), and is axially uniformly formed. The structure including the channel formation member (54) and the partitioning walls (55) has an outside diameter that is slightly larger than the inside diameter of the straight pipe member forming the circular pipe member (53), and thus, is fixed by being press-fitted into the straight pipe member.

The structure including the channel formation member (54) and the partitioning walls (55) is press-fitted into the straight pipe member, and then, both end portions of the straight pipe member are narrowed by drawing to form the connection portions (53b) each having a smaller diameter than the middle portion that will be the body portion (53a) (narrowing step).

The cooler body (51) is assembled through such press-fitting and narrowing steps as described above. As described above, the body portion (53a) of the circular pipe member (53) may be formed separately from the connection portions (53b) thereof, and after the press-fitting step, the cooler body (51) may be assembled, not through the narrowing step, but by brazing the connection portions (53b) to the body portion (53a).

—Advantages of First Embodiment—

In the cooler (50), the radially narrow channel (C0) for a refrigerant is formed in the circular pipe member (53) by the channel formation member (54). The heat transfer coefficient through the circular pipe is inversely proportional to the size of a cross section of the channel through the circular pipe. In other words, with decreasing width of the channel for a heating medium in a direction of the temperature gradient, the heat transfer coefficient is more significantly enhanced. Thus, with the cooler (50), the channel formation member (54) is disposed in the circular pipe member (53), and the radially narrow channel (C0) for a refrigerant is formed in the circular pipe member (53), thereby allowing the heat transfer coefficient through the cooler (50) to be higher than when the channel formation member (54) is not provided. This can enhance the cooling performance of the cooler (50). This enhancement allows the cooler (50) to sufficiently cool the power module (80) having high heat density.

With the cooler (50), the body portion (53a) of the circular pipe member (53) has a larger diameter than the pipe to which the circular pipe member (53) is connected, thereby reducing a reduction in the cross-sectional area of the narrow channel (C0) for a refrigerant due to the provision of the channel formation member (54) in the circular pipe member (53). This reduction can reduce an increase in pressure loss of the refrigerant through the circular pipe member (53) due to the provision of the channel formation member (54) in the circular pipe member (53).

Since, as such, the body portion (53a) of the circular pipe member (53) has a large diameter, this increases the rigidity of the circular pipe member (53), thereby reducing the deformation of the circular pipe member (53) during the removal thereof. This reduction can reduce an increase in contact thermal resistance due to the deformation.

With the cooler (50), the channel formation member (54) is disposed such that the narrow channel (C0) formed in the circular pipe member (53) by the channel formation member (54) forms an annular channel extending along the inner circumferential surface of the circular pipe member (53), and thus, the entire inner circumferential surface of the circular pipe member (53) can be formed as a heat transfer surface. As above, the area where heat is transferred between the refrigerant and the circular pipe member (53) is increased to a maximum area, thereby further enhancing the cooling performance of the cooler (50).

With the cooler (50), the annular narrow channel (C0) formed in the circular pipe member (53) by the channel formation member (54) is circumferentially divided by the plurality of partitioning walls (55), thereby reducing an uneven flow of the refrigerant through the annular narrow channel (C0). When the refrigerant unevenly flows through the annular narrow channel (C0), this flow significantly reduces the efficiency of heat transfer. Therefore, as described above, the uneven flow of the refrigerant through the annular narrow channel (C0) is reduced to provide a generally even flow of the refrigerant in a circumferential direction, thereby enhancing the cooling performance of the cooler (50).

With the cooler (50), the plurality of partitioning walls (55) are connected integrally to the channel formation member (54) by injection-molding a resin, and thus, the plurality of partitioning walls (55) can be easily formed.

In the cooler (50), the power module (80) and the circular pipe member (53) are mounted to the heat transfer member (52) having the recess (52d) into which the circular pipe member (53) is fitted, and the mounting surface (52c) on which the heat dissipation surface of the power module (80) is placed, and thus, heat can be easily exchanged between the power module (80) and the refrigerant through the circular pipe member (53). Therefore, the heat generated in the power module (80) can be efficiently absorbed through the heat transfer member (52) by the refrigerant through the circular pipe member (53), thereby efficiently cooling the power module (80).

In particular, in the cooler (50), the recess (52d) is formed in a surface of the heat transfer member (52) opposite to the mounting surface (52c) at a location corresponding to the power module (80) mounted on the mounting surface (52c), and thus, the power module (80) and the circular pipe member (53) are mounted on the front and back surfaces, respectively, of the heat transfer member (52), and are located to correspond to each other. This location allows the heat path from the power module (80) through the heat transfer member (52) to the circular pipe member (53) to be shorter than when the location of the power module (80) does not correspond to that of the circular pipe member (53). This reduces the thermal resistance between the power module (80) and the circular pipe member (53). Thus, the cooling performance of the cooler (50) can be further enhanced.

Incidentally, when a U-shaped pipe is used as the circular pipe member (53), and two straight pipe portions of the U-shaped pipe are fitted into two recesses (52d) of the heat transfer member (52), the pressure of one of the straight pipe portions against the inner surface of a corresponding one of the recesses (52d) may cause the contact between the other straight pipe portion and the inner surface of the other recess (52d) to be poor depending on the manner in which the U-shaped pipe is finished, and the heat transfer performance may be decreased.

However, with the cooler (50), the circular pipe member (53) is a single straight pipe member. Therefore, the circular pipe member (53) and the inner surface of the recess (52d) can be easily brought into contact with each other simply by fitting the circular pipe member (53) into the recess (52d) and pressing the circular pipe member (53) against the inner surface. This can easily reduce the contact thermal resistance between the circular pipe member (53) and the heat transfer member (52), thereby enhancing the cooling performance of the cooler (50).

<<Second Embodiment of the Invention>>

Figure 5:
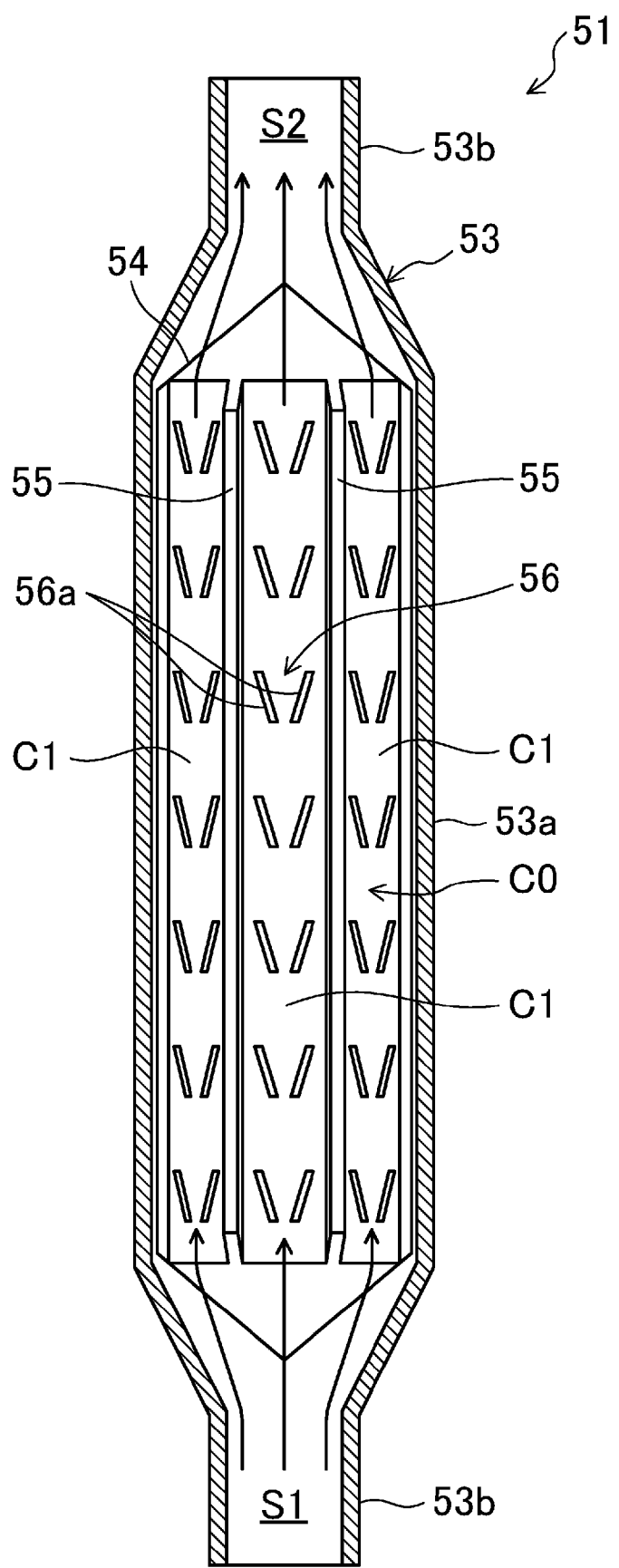
FIG. 5 is a diagram illustrating an internal structure of a cooler body from which a portion of a circular pipe member is removed according to a second embodiment.

As illustrated in FIG. 5, in a second embodiment, the configuration of the cooler body (51) of the first embodiment is partially changed. FIG. 5 is a diagram illustrating an internal structure of a cooler body (51) from which a portion of a circular pipe member (53) of the cooler body (51) (a front half portion thereof in FIG. 5) is removed.

Specifically, a plurality of axial channels (C1) formed by a channel formation member (54) and a plurality of axially extending partitioning walls (55) each include turbulent flow accelerator members (56). The turbulent flow accelerator members (56) are a plurality of protruding pieces (56a) connected integrally to the channel formation member (54) by injection-molding a resin. Two of the protruding pieces (56a)

arranged in a V configuration are paired, and a plurality of (seven in this embodiment) pairs of the protruding pieces (56a) are axially arranged in each of the axial channels (C1). The plurality of protruding pieces (56a) correspond to a so-called voltex generator.

Provision of the plurality of protruding pieces (56a) in each of the axial channels (C1) accelerates a transition of a boundary layer in the axial channel (C1), thereby accelerating a laminar-to-turbulent flow transition. This enhances the heat transfer coefficient between a refrigerant and the circular pipe member (53). Consequently, the cooling performance of the cooler (50) can be further enhanced.

Furthermore, since, with the configuration, the turbulent flow accelerator members (56) are the plurality of protruding pieces (56a) connected integrally to the channel formation member (54) by injection-molding a resin, the turbulent flow accelerator members (56) can be easily formed.

<<Third Embodiment of the Invention>>

As illustrated in FIG. 6, in a third embodiment, the configuration of the cooler body (51) of the first embodiment is partially changed.

Specifically, a plurality of axial channels (C1) formed by a channel formation member (54) and a plurality of axially extending partitioning walls (55) each include a heat transfer plate (57) made of a metal. The heat transfer plate (57) is made of a metal and connected integrally to the circular pipe member (53), and axially extends so as to be formed in the form of a plate.

Such provision of the heat transfer plate (57) made of a metal and connected integrally to the circular pipe member (53) in each of the axial channels (C1) can increase the area where heat is transferred between a refrigerant through the axial channel (C1) and the circular pipe member (53). Therefore, the cooling performance of the cooler (50) can be further enhanced.

In the cooler (50) of the third embodiment, the channel formation member (54) of the second embodiment may be used instead of the channel formation member (54) of this embodiment.

<<Fourth Embodiment of the Invention>>

Figure 8:
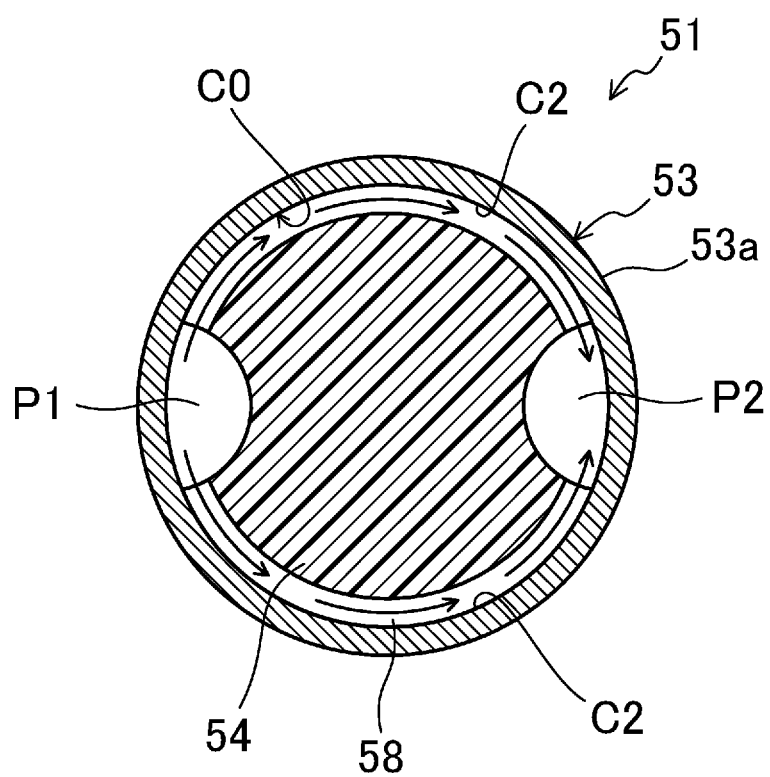
FIG. 8 is a cross-sectional view of the cooler body according to the fourth embodiment.

As illustrated in FIGS. 7(A), 7(B), and 8, in a fourth embodiment, the configuration of the cooler body (51) of the first embodiment is partially changed, and a narrow channel (C0) is configured to allow a refrigerant to flow therethrough in a circumferential direction. FIG. 7(A) is a diagram illustrating an internal structure of a cooler body (51) from which a portion of a circular pipe member (53) of the cooler body (51) (a front half portion thereof in FIG. 7(A)) is removed, and FIG. 7(B) is a longitudinal cross-sectional view of the cooler body (51). FIG. 8 is a cross-sectional view of the cooler body (51).

Specifically, in the fourth embodiment, the cooler body (51) includes a circular pipe member (53), a channel formation member (54) provided in the circular pipe member (53) such that a later-described narrow channel (C0) is formed between the channel formation member (54) and the inner circumferential surface of the circular pipe member (53), and partitioning walls (58) axially dividing the narrow channel (C0) formed by the channel formation member (54) into a plurality of sub-channels.

The channel formation member (54) is formed in the shape of a solid cylinder having a slightly smaller diameter than a body portion (53a) of the circular pipe member (53). As illustrated in FIG. 8, the channel formation member (54) is disposed such that its axis coincides with the axis of the circular pipe member (53). When the channel formation member (54) is placed as above, the annular narrow channel (C0) having a small radial width is formed between the outer circumferential surface of the channel formation member (54) and the inner circumferential surface of the body portion (53a) of the circular pipe member (53).

Also in the fourth embodiment, while a first space (S1) is formed in a portion of the circular pipe member (53) of the cooler body (51) toward one axial end of the channel formation member (54) by the channel formation member (54), a second space (S2) is formed in a portion of the circular pipe member (53) toward the other axial end thereof.

The partitioning walls (58) are each made of an annular plate-like member extending outward from the entire outer circumferential surface of the channel formation member (54). In the fourth embodiment, the number of the partitioning walls (58) is five, and the narrow channel (C0) is axially divided into four circumferentially extending circumferential channels (C2). In the fourth embodiment, the five partitioning walls (58) are connected integrally to the channel formation member (54) by injection-molding a resin. A structure including the channel formation member (54) and the partitioning walls (58) which are integrally connected together has an outside diameter that is slightly larger than the inside diameter of the body portion (53a) of the circular pipe member (53), and is fixed by being press-fitted into the body portion (53a).

Furthermore, in the fourth embodiment, the channel formation member (54) includes a first communication passage (P1) allowing communication between the first space (51) and the circumferential channels (C2), and a second communication passage (P2) allowing communication between the second space (S2) and the circumferential channels (C2). The first and second communication passages (P1) and (P2) are each defined by an axially extending groove formed in the outer circumferential surface of the channel formation member (54). The first communication passage (P1) is open to the first space (S1), and is not open to the second space (S2), and the second communication passage (P2) is open to the second space (S2), and is not open to the first space (S1).

A portion of one of the five partitioning walls (58) bordering the first space (S1) (the lowermost partitioning wall (58) in FIGS. 7(A) and 7(B)) is removed to correspond to the first communication passage (P1), and a portion of one thereof bordering the second space (S2) (the uppermost partitioning wall (58) in FIGS. 7(A) and 7(B)) is removed to correspond to the second communication passage (P2), and two portions of each of the other three partitioning walls (58) except the outermost partitioning walls (58) are removed to correspond to the first and second communication passages (P1) and (P2).

Also in the fourth embodiment, one of the connection portions (53b) of the circular pipe member (53) of the cooler body (51) near the first space (S1) is connected through a portion of the refrigerant pipe to the outdoor heat exchanger (42), and the other connection portion (53b) near the second space (S2) is connected through a portion of the refrigerant pipe to the expansion valve (43). Therefore, in cooling operation, the first space (S1) in the circular pipe member (53) forms an inlet space, and the second space (S2) therein forms an outlet space. The first communication passage (P1) forms an inlet side communication passage, and the second communication passage (P2) forms an outlet side communication passage. By contrast, in heating operation, the second space (S2) in the circular pipe member (53) forms an inlet space, and the first space (S1) therein forms an outlet space. The second communication passage (P2) forms an inlet side communication passage, and the first communication passage (P1) forms an outlet side communication passage.

—Operational Behavior—

The flow of a refrigerant through a refrigerant circuit (20) is similar to that in the first embodiment. The flow of a refrigerant through the cooler body (51) different from that in the first embodiment will be described hereinafter.

<Cooling Operation>

During a cooling operation, a refrigerant that has flowed into the cooler body (51) initially flows into the first space (S1) of the circular pipe member (53). Then, the refrigerant that has flowed into the first space (S1) flows into the first communication passage (P1) which is open to the first space (S1), and axially flows therethrough. Then, the refrigerant is diverted from the first communication passage (P1) into the four circumferential channels (C2) by the partitioning walls (58). The refrigerant that has been diverted thereinto circumferentially flows through the circumferential channels (C2), and portions of the refrigerant that has flowed therethrough flow into the second communication passage (P2), and join. The refrigerant that has joined in the second communication passage (P2) axially flows through the second communication passage (P2), flows into the second space (S2) to which the second communication passage (P2) is open, axially passes through the second space (S2), and flows out of the cooler body (51).

<Heating Operation>

During a heating operation, a refrigerant that has flowed into the cooler body (51) initially flows into the second space (S2) of the circular pipe member (53). Then, the refrigerant that has flowed into the second space (S2) flows into the second communication passage (P2) which is open to the second space (S2), and axially flows therethrough. Then, the refrigerant is diverted from the second communication passage (P2) into the four circumferential channels (C2) by the partitioning walls (58). The refrigerant that has been diverted thereinto circumferentially flows through the circumferential channels (C2), and portions of the refrigerant that has flowed therethrough flow into the first communication passage (P1), and join. The refrigerant that has joined in the first communication passage (P1) axially flows through the first communication passage (P1), and flows into the first space (S1) to which the first communication passage (P1) is open, axially passes through the first space (S1), and flows out of the cooler body (51).

—Advantages of Fourth Embodiment—

Also with the cooler (50) of the fourth embodiment, the channel formation member (54) is disposed in the circular pipe member (53), and the radially narrow channel (C0) for a refrigerant is formed in the circular pipe member (53), thereby allowing the heat transfer coefficient through the cooler (50) to be higher than when the channel formation member (54) is not provided. This can enhance the cooling performance of the cooler (50). This enhancement allows the cooler (50) to sufficiently cool the power module (80) having high heat density.

With the cooler (50) of the fourth embodiment, the radially narrow channel (C0) is axially divided into the plurality of circumferentially extending circumferential channels (C2). Thus, as compared to when the narrow channel (C0) is circumferentially divided into axially extending division channels, the cross-sectional area of each of the channels is increased to reduce the velocity of flow of the refrigerant, and the length of each of the channels is reduced. This can reduce the pressure loss of the refrigerant through each of the circumferential channels (C2).

With the cooler (50) of the fourth embodiment, the annular narrow channel (C0) formed in the circular pipe member (53) is axially divided by the plurality of partitioning walls (58), thereby reducing an uneven flow of the refrigerant through the annular narrow channel (C0). Here, when the refrigerant unevenly flows through the annular narrow channel (C0), this flow significantly reduces the efficiency of heat transfer. Therefore, as described above, the uneven flow of the refrigerant through the annular narrow channel (C0) is reduced to provide a generally even flow of the refrigerant in the axial direction, thereby enhancing the cooling performance of the cooler (50).

In the fourth embodiment, the narrow channel (C0) is axially divided into the plurality of circumferential channels (C2) by the plurality of partitioning walls (58); however, a single circumferential channel (C2) may be defined by two partitioning walls (58). Also with such a configuration, the refrigerant circumferentially flows through the narrow channel (C0), and thus, as compared to when the refrigerant axially flows through the narrow channel (C0), the cross-sectional area of the channel is increased to reduce the velocity of flow of the refrigerant, and the length of the channel is reduced. This can reduce the pressure loss of the refrigerant through the narrow channel (C0).

<<Fifth Embodiment of the Invention>>

Figure 9:
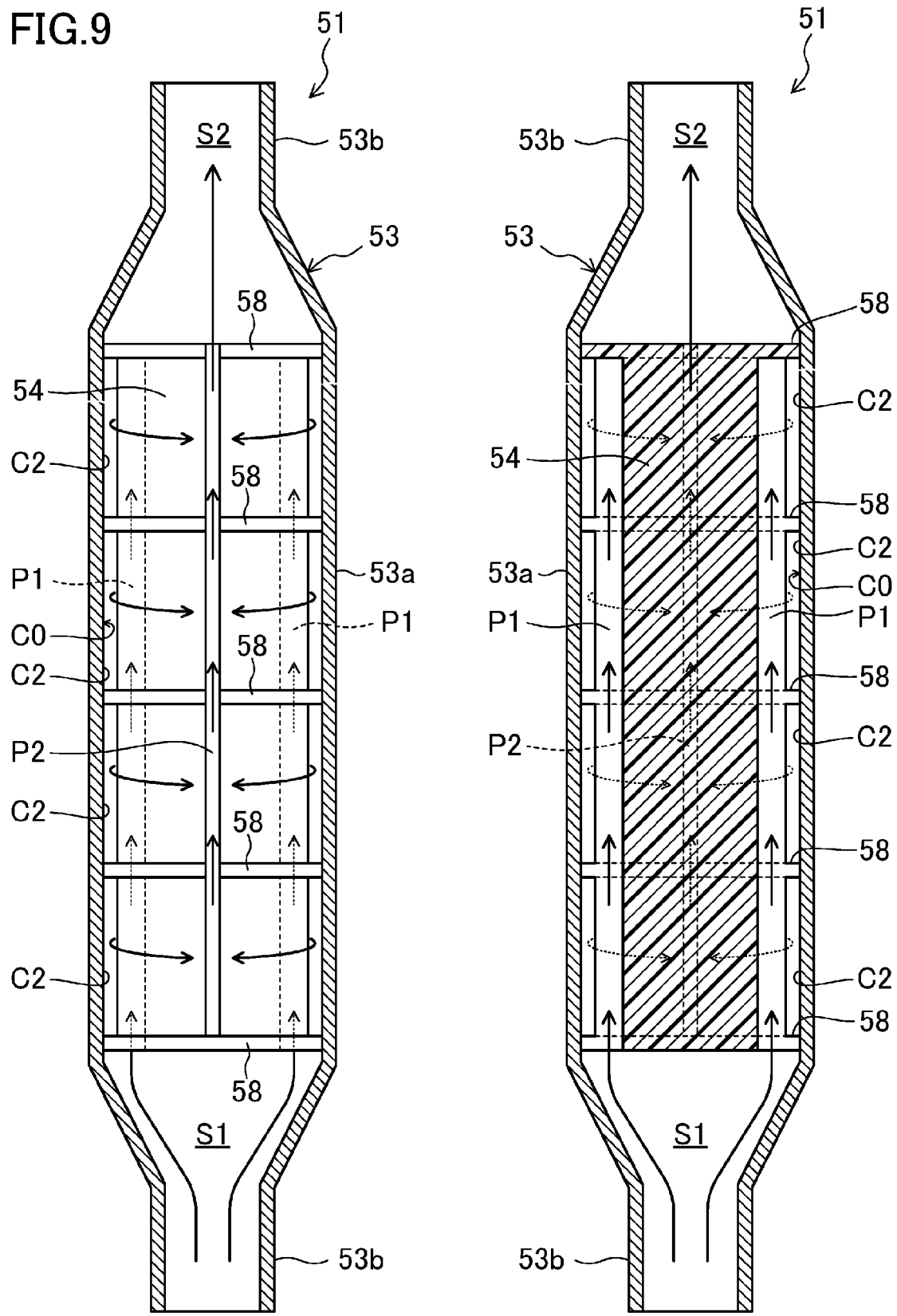
FIG. 9(A) is a diagram illustrating an internal structure of a cooler body from which a portion of a circular pipe member is removed according to a fifth embodiment.
FIG. 9(B) is a longitudinal cross-sectional view of the cooler body according to the fifth embodiment.
Figure 10:
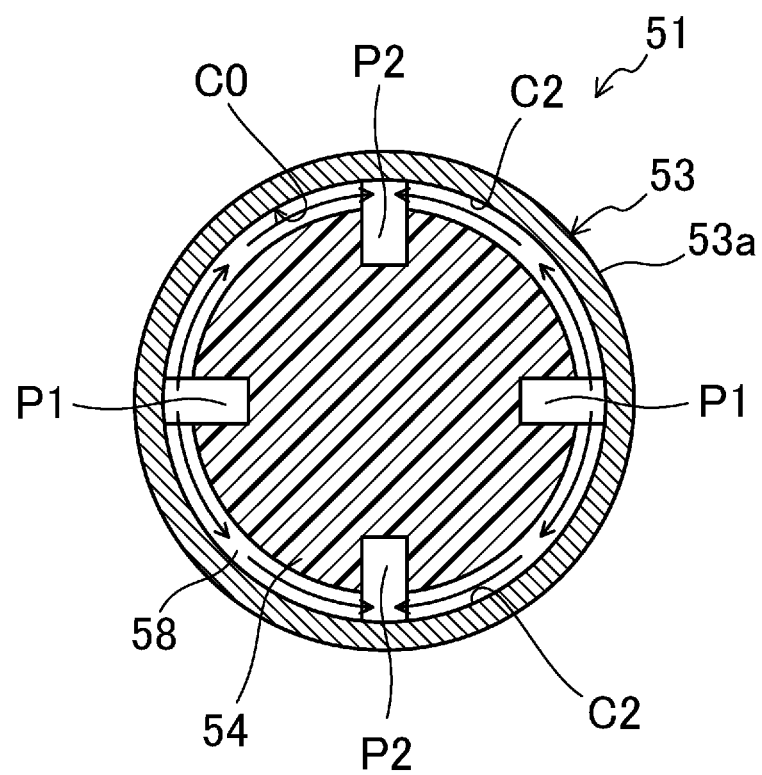
FIG. 10 is a cross-sectional view of the cooler body according to the fifth embodiment.

As illustrated in FIGS. 9(A), 9(B), and 10, in a fifth embodiment, the configuration of the cooler body (51) of the fourth embodiment is partially changed. FIG. 9(A) is a diagram illustrating an internal structure of a cooler body (51) from which a portion of a circular pipe member (53) of the cooler body (51) (a front half portion thereof in FIG. 9(A)) is removed, and FIG. 9(B) is a longitudinal cross-sectional view of the cooler body (51). FIG. 10 is a cross-sectional view of the cooler body (51).

Specifically, while, in the fourth embodiment, the single first communication passage (P1) and the single second communication passage (P2) are formed in the channel formation member (54), a plurality of first communication passages (P1) and a plurality of second communication passages (P2) are formed here. In FIGS. 9(A), 9(B), and 10, two first communication passages (P1) and two second communication passages (P2) are formed in the channel formation member (54). The first and second communication passages (P1) and (P2) are alternately arranged in a circumferential direction.

The formation of the communication passages as described above can also provide advantages similar to those of the fourth embodiment. Such a configuration can further reduce the pressure loss of the refrigerant circulating through the circular pipe member (53).

<<Sixth Embodiment of the Invention>>

Figure 11:
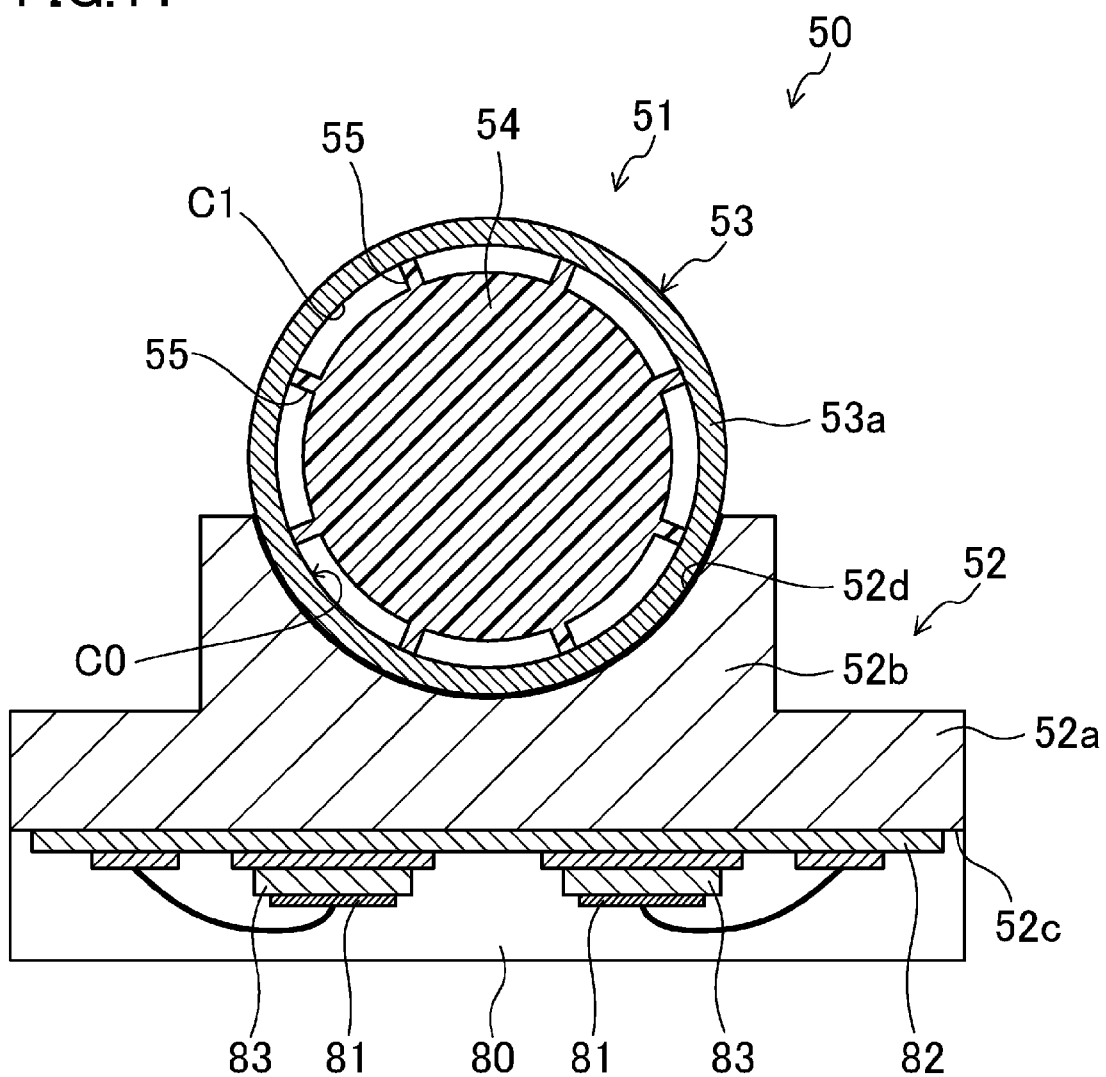
FIG. 11 is a cross-sectional view of a cooler and a power module according to a sixth embodiment.

As illustrated in FIG. 11, in a sixth embodiment, the configuration of the power module (80) mounted to the cooler (50) of the first embodiment is partially changed.

Specifically, in the first embodiment, the power module (80) placed on the mounting surface (52c) of the heat transfer member (52) of the cooler (50) has an insulating substrate (82) having a surface on which a plurality of power semiconductor chips (81) are mounted, and a heatsink made of a metal plate is placed on a surface of the insulating substrate (82) opposite to the surface on which the power semiconductor chips are mounted; however, in the sixth embodiment, the metal plate is not provided.

In the sixth embodiment, a power module (80) has an insulating substrate (82) on which a plurality of power semiconductor chips (81) are mounted, and the power semiconductor chips (81) are connected together through bonding wires and encapsulated with a resin. A surface of the insulating substrate (82) opposite to a surface thereof on which the power semiconductor chips (81) are mounted forms a heat dissipation surface of the power module (80), and the power module (80) is mounted on a mounting surface (52c) of a heat transfer member (52). Specifically, the mounting surface (52c) and the insulating substrate (82) are joined together with a thermally conductive adhesion sheet.

While, in FIG. 11, the reference character 83 is used to represent a heat spreader, the heat spreaders 83 does not need to be provided. Furthermore, while, in FIG. 11, the power semiconductor chips (81) are connected together through bonding wires, they may be connected together through lead frames.

As such, a metal plate of the power module (80) is omitted, and the insulating substrate (82) on which the power semiconductor chips (81) are mounted is placed directly on the mounting surface (52c) of the heat transfer member (52), thereby reducing the thermal resistance between the power module (80) and the cooler (50). Thus, the power module (80) can be more efficiently cooled.

<<Seventh Embodiment of the Invention>>

As illustrated in FIGS. 12(A) and 12(B), in a seventh embodiment, the configuration of the cooler body (51) of the first embodiment is partially changed.

Specifically, an outermost portion of each of partitioning walls (55) includes a fixing structure (60). As illustrated in FIG. 12(B) under magnification, the fixing structure (60) includes two protruding pieces (61) protruding from the outermost portion of the partitioning wall (55) and facing each other in an axial direction, and the two protruding pieces (61) are formed to be closer to each other toward their front ends. When a channel formation member (54) and the partitioning walls (55) are inserted into a circular pipe member (53), the two protruding pieces (61) are formed so as to be elastically deformed by abutting against the inner circumferential surface of the circular pipe member (53). Specifically, as illustrated in FIG. 12(B), when the channel formation member (54) and the partitioning walls (55) are inserted into the circular pipe member (53), the two protruding pieces (61) are elastically deformed so as to be folded toward a corresponding one of the partitioning walls (55). In this case, the two protruding pieces (61) press the inner circumferential surface of the circular pipe member (53) outward so as to be restored to their original shapes. The channel formation member (54) and the partitioning walls (55) are fixed by the restoring forces of such protruding pieces (61) so as to be prevented from moving in the circular pipe member (53).

In FIGS. 12(A) and 12(B), the partitioning walls (55) each include the two fixing structures (60); however, the number of the fixing structures (60) and the locations at which they are formed are not limited to those in FIGS. 12(A) and 12(B).

Furthermore, the fixing structures (60) can be used in each of the second, third, and sixth embodiments, and may be used for the partitioning walls (58) of each of the fourth and fifth embodiments.

<<Eighth Embodiment of the Invention>>

Figure 13:
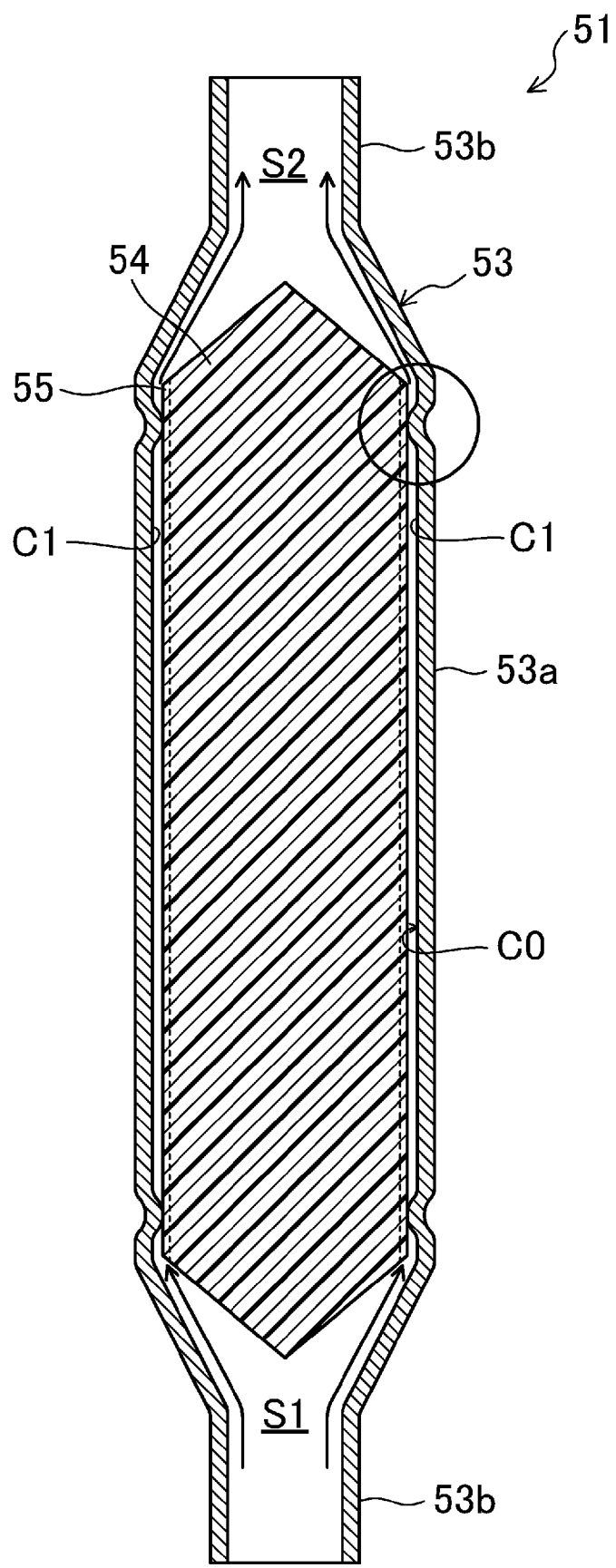
FIG. 13 is a longitudinal cross-sectional view of a cooler body according to an eighth embodiment.

As illustrated in FIG. 13, in an eighth embodiment, the configuration of the cooler body (51) of the first embodiment is partially changed.

Specifically, in the first embodiment, the channel formation member (54) and the partitioning walls (55) which are integrally connected together are fixed by being press-fitted into the circular pipe member (53); however, in the eighth embodiment, a channel formation member (54) and partitioning walls (55) are inserted into a circular pipe member (53), and are fixed by squeezing portions of the circular pipe member (53). Therefore, in the eighth embodiment, a structure including the channel formation member (54) and the partitioning walls (55) has an outside diameter that is slightly smaller than the inside diameter of a body portion (53a) of the circular pipe member (53).

Also with such a configuration as described above, the channel formation member (54) and the partitioning walls (55) can be securely fixed so as to be prevented from moving in the circular pipe member (53).

As illustrated in FIG. 13, two upper and lower portions of the circular pipe member (53) are preferably squeezed; however, portions of the circular pipe member (53) to be squeezed are not limited to the two portions.

Such a method for fixing the channel formation member (54) and the partitioning walls (55) as described above can be applied to each of the second, third, and sixth embodiments.

<<Ninth Embodiment of the Invention>>

Figure 14:
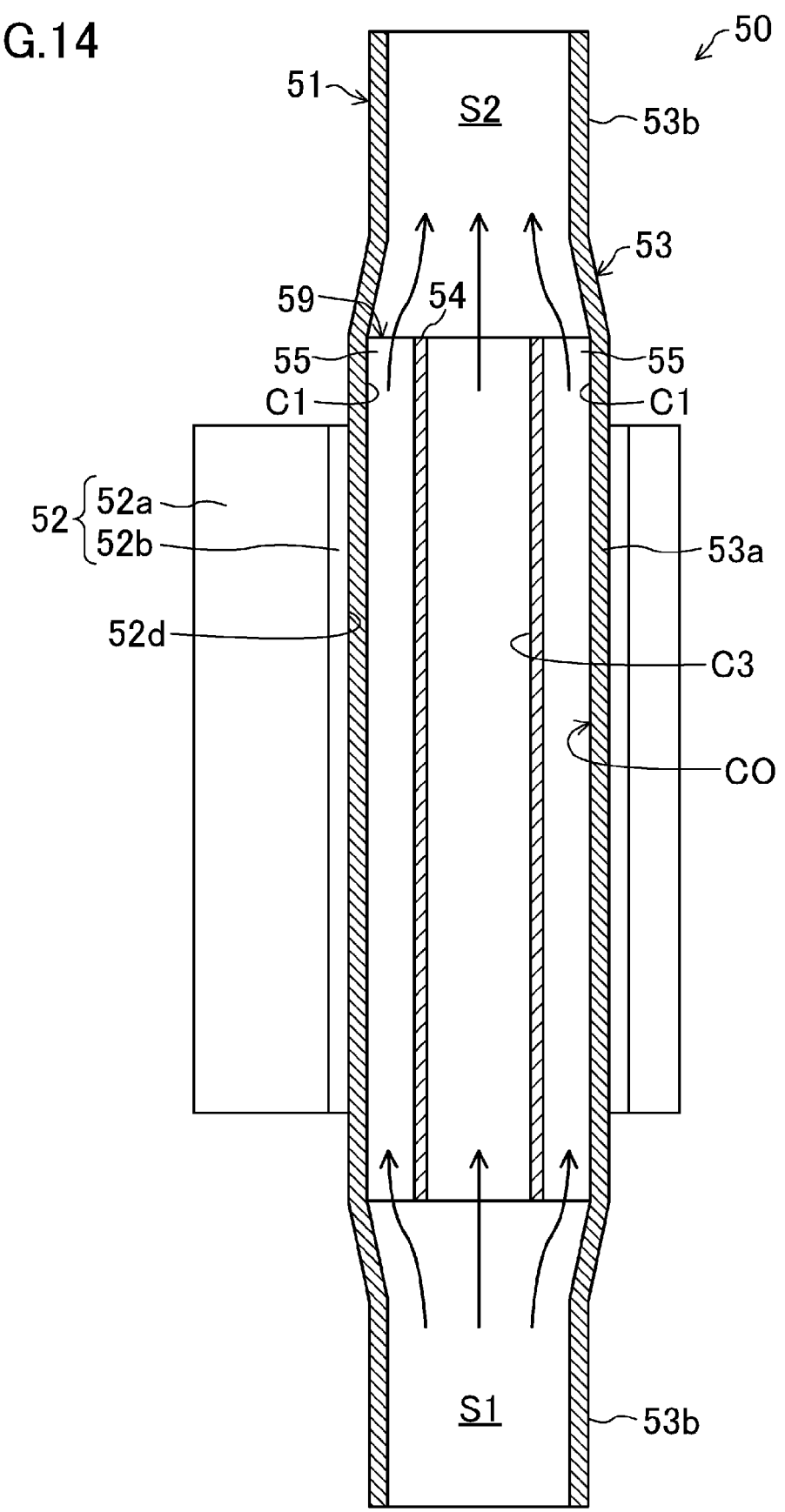
FIG. 14 is a longitudinal cross-sectional view of a cooler according to a ninth embodiment.
Figure 15:
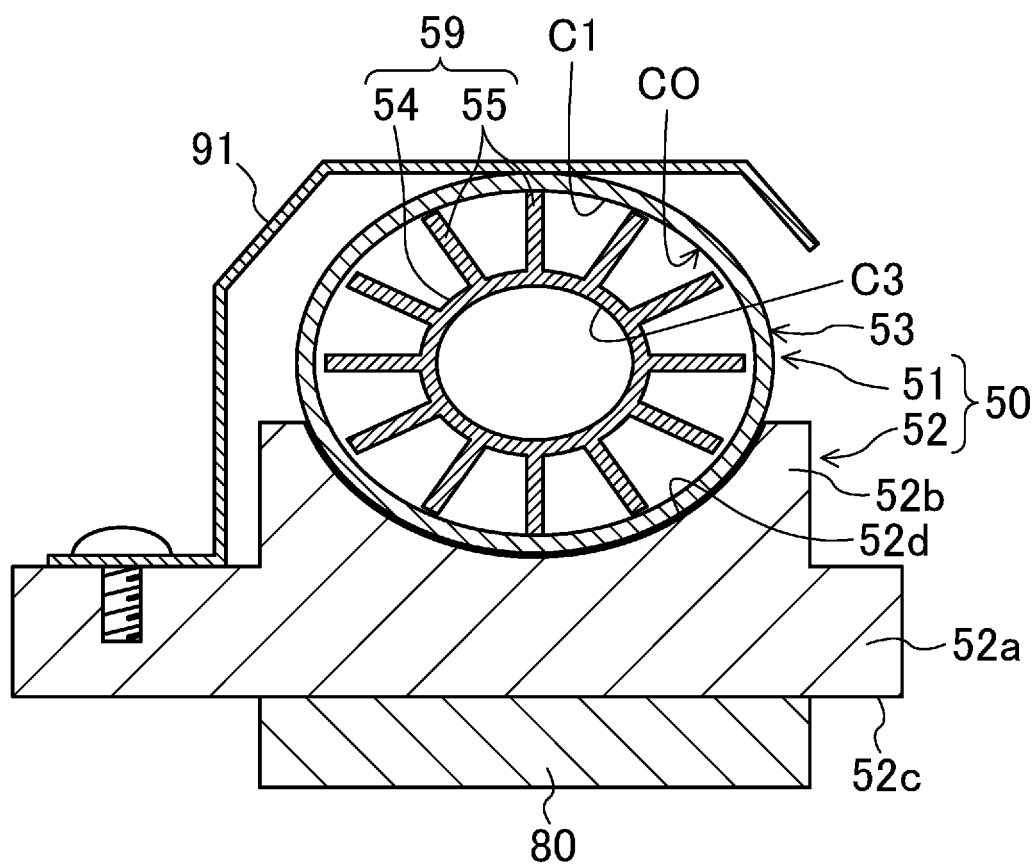
FIG. 15 is a cross-sectional view of the cooler and a power module according to the ninth embodiment.

As illustrated in FIGS. 14 and 15, in a ninth embodiment, the configuration of the cooler body (51) and the configuration of the heat transfer member (52) according to the first embodiment are partially changed.

In the ninth embodiment, a channel formation member (54) and a plurality of partitioning walls (55) are made of a material with high thermal conductivity, e.g., a metal, such as aluminum or copper, and integrally connected together to form a spacer (59). The channel formation member (54) is formed in the shape of a hollow cylinder. A narrow channel (C0) is formed between the outer circumferential surface of the hollow cylindrical channel formation member (54) and the inner circumferential surface of a circular pipe member (53). By contrast, an internal channel (C3) is formed inside the hollow cylindrical channel formation member (54). In the ninth embodiment, the number of the partitioning walls (55) is twelve, and the narrow channel (C0) is circumferentially divided into twelve sub-channels. The channel formation member (54) has a smaller diameter than the channel formation member (54) of the first embodiment, and the radial length of each of the partitioning walls (55) is longer than that of each of the partition walls (55) of the first embodiment.

By contrast, in the ninth embodiment, the circular pipe member (53) has a body portion (53a) having a slightly larger diameter than each of its connection portions (53b), but having substantially the same diameter as that of the connection portion (53b). In other words, the body portion (53a) has substantially the same diameter as that of a refrigerant pipe of a refrigerant circuit (20) to which the circular pipe member (53) is connected.

In the first embodiment, the circular pipe member (53) and the spacer (59) are fixed by press-fitting the spacer (59) into the circular pipe member (53). However, in the ninth embodiment, after the spacer (59) is inserted into the circular pipe member (53), the circular pipe member (53) and the spacer (59) are pressed in predetermined directions to deform the circular pipe member (53) into an oval shape, thereby allowing the circular pipe member (53) and the spacer (59) to be in contact with each other such that heat can be transferred therebetween, and to be fixed to each other.

Specifically, as illustrated in FIG. 16(A), the spacer (59) has an outside diameter that is slightly smaller than the inside diameter of the body portion (53a) of the circular pipe member (53). While the spacer (59) is inserted into the circular pipe member (53) (i.e., in the state in FIG. 16(A)), the circular pipe member (53) and the spacer (59) are pressed in predetermined directions with a press such that the circular pipe member (53) has an oval cross section (see FIG. 16(B)). The circular pipe member (53) and the spacer (59) are deformed by such pressing so as to be crushed in the pressing directions in which they are pressed, and thus, the circular pipe member (53) has an oval cross section. In this case, the diameter of each of the circular pipe member (53) and the spacer (59) in the pressing directions is reduced, and thus, the inner wall of the circular pipe member (53) is in contact with the outer ends of some of the partitioning walls (55) of the spacer (59) in the pressing directions, and is fixed to the outer ends. As described above, since, in the ninth embodiment, the spacer (59) is made of a metal with high thermal conductivity, heat can be transferred between the circular pipe member (53) and the spacer (59) by bringing the circular pipe member (53) and the spacer (59) into contact with each other. Thus, both the circular pipe member (53) and the spacer (59) form heat dissipation members configured to dissipate heat of a power module (80) which is a heat generating component to a heating medium flowing through the narrow channel (C0) in the circular pipe member (53).

When the circular pipe member (53) is fitted into a recess (52d) of the heat transfer member (52), the circular pipe member (53) and the spacer (59) are pressed to reduce the diameter of the circular pipe member (53) connecting part thereof closest to the power module (80) and part thereof furthest from the power module (80).

As illustrated in FIG. 15, in the ninth embodiment, the recess (52d) which is formed in a holding portion (52b) of the heat transfer member (52) and into which the circular pipe member (53) is fitted is formed in a semioval shape such that the circular pipe member (53) deformed to have the oval cross section can be fitted thereinto. The circular pipe member (53) fitted into the recess (52d) of the heat transfer member (52) is fixed by being pressed against the recess (52d) with a presser plate (91) screwed into the heat transfer member (52).

In view of the above, in the ninth embodiment, the plurality of partitioning walls (55) and the channel formation member (54) are made of a metal, and integrally connected together to form the spacer (59), and the circular pipe member (53) and the spacer (59) are both deformed to bring the spacer (59) into contact with the circular pipe member (53) such that heat can be transferred therebetween; therefore, both the circular pipe member (53) and the spacer (59) can form heat dissipation members configured to dissipate heat of the power module (80) which is a heat generating component to a heating medium flowing through the narrow channel (C0) in the circular pipe member (53). This can increase the area where heat is dissipated to the heating medium flowing through the narrow channel (C0) in the circular pipe member (53), thereby enhancing the cooling performance of a cooler (50).

Furthermore, according to the ninth embodiment, with the spacer (59) located in the circular pipe member (53), the circular pipe member (53) and the spacer (59) are pressed in predetermined directions so as to be deformed, and thus, are fixed to each other; therefore, the circular pipe member (53) and the spacer (59) can be easily brought into contact with each other such that heat can be transferred therebetween, and can be easily fixed to each other without providing a fixture having a complicated structure.

<<Tenth Embodiment of the Invention>>

In a tenth embodiment, the configuration of the cooler body (51) of the ninth embodiment is partially changed.

Figure 17A:
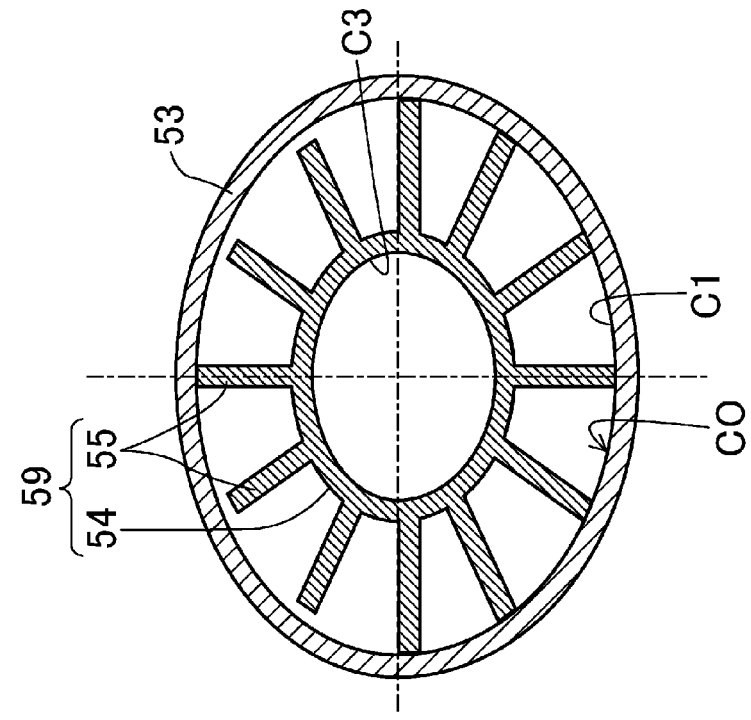
FIGS. 17(A) and 17(B) are operation diagrams where a circular pipe member of a cooler body and a spacer according to a tenth embodiment are pressed.
Figure 17B:
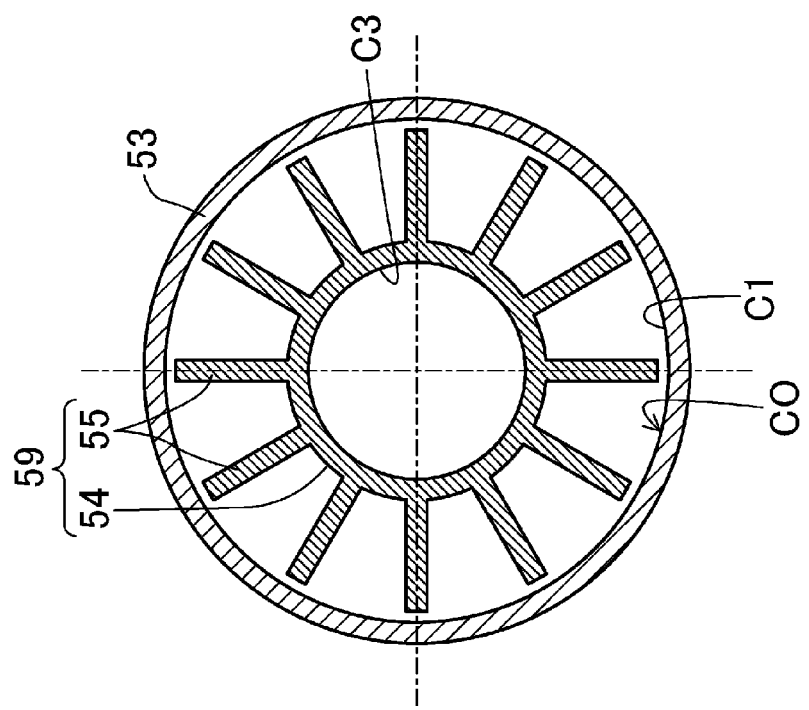

Specifically, as illustrated in FIGS. 17(A) and 17(B), in the tenth embodiment, a circular pipe member (53) and a spacer (59) are pressed such that the curvature of a portion of the circular pipe member (53) near a heat-generating power module (80) (a lower portion thereof in FIG. 15) is larger than that of a portion of the circular pipe member (53) opposite to the heat-generating power module (80).

Incidentally, when, as described above, the circular pipe member (53) and the spacer (59) are pressed in predetermined directions so as to be deformed, the circular pipe member (53) and the spacer (59) are easily in contact with each other in the pressing directions, and are, however, easily separated from each other in directions orthogonal to the pressing directions; therefore, a large contact area cannot be ensured as a whole.

However, since, as described above, the circular pipe member (53) and the spacer (59) are pressed such that the curvature of the portion of the circular pipe member (53) near the heat-generating power module (80) (the lower portion thereof in FIG. 15) is larger than that of the portion of the circular pipe member (53) opposite to the heat-generating power module (80), the spacer (59) is entirely pressed toward the heat-generating power module (80). This can increase the area of contact between the portion of the circular pipe member (53) near the heat-generating power module (80) and a portion of the spacer (59) near the heat-generating power module (80). This can increase the area where heat is dissipated to the refrigerant flowing through a portion of the narrow channel (C0) near the heat-generating power module (80) in the circular pipe member (53), thereby enhancing the cooling performance. Therefore, the power module (80) can be efficiently cooled.

<<Eleventh Embodiment of the Invention>>

In an eleventh embodiment, the configuration of the cooler body (51) of the ninth embodiment is partially changed.

Specifically, as illustrated in FIGS. 18(A) and 18(B), in the eleventh embodiment, a portion (54b) of a hollow cylindrical channel formation member (54) near a heat-generating power module (80) is thinner than a portion (54a) thereof opposite to the heat-generating power module (80). Thus, the rigidity of a portion of a spacer (59) near the heat-generating power module (80) is lower than that of a portion thereof opposite to the heat-generating power module (80).

Incidentally, when, as described above, the circular pipe member (53) and the spacer (59) are pressed in predetermined directions so as to be deformed, the circular pipe member (53) and the spacer (59) are easily in contact with each other in pressing directions, and are, however, easily separated from each other in directions orthogonal to the pressing directions; therefore, a large contact area cannot be ensured as a whole.

However, in the eleventh embodiment, the portion (54b) of the channel formation member (54) near the heat-generating power module (80) is thinner than the portion (54b) thereof opposite to the heat-generating power module (80). Therefore, when the spacer (59) is pressed while being located in the circular pipe member (53), the spacer (59) is entirely pressed toward the power module (80), because the portion of the spacer (59) near the heat-generating power module (80) has lower rigidity than the portion thereof opposite to the heat-generating power module (80). Thus, the area of contact between a portion of the circular pipe member (53) near the heat-generating power module (80) and the portion of the spacer (59) near the heat-generating power module (80) can be increased. This can increase the area where heat is dissipated to the refrigerant flowing through a portion of the narrow channel (C0) near the heat-generating power module (80) in the circular pipe member (53), thereby enhancing the cooling performance. Therefore, the power module (80) can be efficiently cooled.

Since, in the eleventh embodiment, the portion (54b) of the channel formation member (54) near the heat-generating power module (80) is thinner than the portion (54a) thereof opposite to the heat-generating power module (80), the cross-sectional area of each of some of a plurality of axial channels (C1) near the power module (80) is larger than that of each of the other axial channels (C1) opposite to the power module (80). This allows a large amount of fluid to circulate through a portion of the narrow channel (C0) near the power module (80), thereby further enhancing the cooling performance of a portion of a cooler (50) near the power module (80). Therefore, the power module (80) can be efficiently cooled.

<<Twelfth Embodiment of the Invention>>

In a twelfth embodiment, the configuration of a cooler body (51) of the ninth embodiment is partially changed.

Specifically, as illustrated in FIGS. 19(A) and 19(B), in the twelfth embodiment, a spacer (59) is formed such that the cross-sectional area of each of some of a plurality of axial channels (C1) near a heat-generating power module (80) is larger than that of each of the other axial channels (C1) opposite to the heat-generating power module (80). Specifically, a portion of each of some of the plurality of partitioning walls (55) opposite to the power module (80) is thicker than each of the other portions thereof. More specifically, a central portion of each of some of the partitioning walls (55) opposite to the heat-generating power module (80) has a cross section formed in a trapezoidal configuration which is wider radially outward, and forms a thick portion (55a) which is thicker than each of the other portions thereof. The formation of such a thick portion (55a) allows the cross-sectional area of each of the axial channels (C1) opposite to the heat-generating power module (80) to be smaller than that of each of the axial channels (C1) near the heat-generating power module (80). Therefore, a large amount of the refrigerant circulates through the axial channels (C1) near the heat-generating power module (80).

In the twelfth embodiment, four of the twelve partitioning walls (55) are extended into an internal channel (C3) inside a hollow cylindrical channel formation member (54). This increases the area where heat is transferred to a refrigerant circulating through the internal channel (C3).

In view of the above, according to the twelfth embodiment, the partitioning walls (55) are formed such that the cross-sectional area of each of some of the plurality of axial channels (C1) near the heat-generating power module (80) is larger than that of each of the other axial channels (C1) opposite to the heat-generating power module (80), thereby allowing a large amount of the refrigerant to circulate through a portion of a narrow channel (C0) near the power module (80). This can enhance the cooling performance of a portion of a cooler (50) near the power module (80), and thus, the power module (80) can be efficiently cooled.

According to the twelfth embodiment, since four of the twelve partitioning walls (55) are extended into the hollow cylindrical channel formation member (54), this can increase the area where heat is transferred to the refrigerant circulating through the interior of the hollow cylindrical channel formation member (54). This can further increase the area where heat is dissipated to the refrigerant flowing through the circular pipe member (53), thereby enhancing the cooling performance. Therefore, the power module (80) can be efficiently cooled.

<<Thirteenth Embodiment of the Invention>>

In a thirteenth embodiment, the configuration of the cooler body (51) of the ninth embodiment is partially changed.

Specifically, as illustrated in FIGS. 20(A) and 20(B), in the thirteenth embodiment, a spacer (59) is formed such that the cross-sectional area of each of some of a plurality of axial channels (C1) near a heat-generating power module (80) is larger than that of each of the other axial channels (C1) opposite to the heat-generating power module (80). Specifically, in the thirteenth embodiment, the axis of a hollow cylindrical channel formation member (54) is shifted from the axis of a circular pipe member (53) in a direction away from the power module (80). A plurality of partitioning walls (55) radially extend from the channel formation member (54) the axis of which is shifted as described above, and thus, the radial length of each of some of the partitioning walls (55) near the heat-generating power module (80) is longer than that of each of the other partitioning walls (55) opposite to the heat-generating power module (80). The axis of the channel formation member (54) is shifted as described above such that the radial length of each of the partitioning walls (55) near the heat-generating power module (80) is longer than that of each of the other partitioning walls (55) opposite to the heat-generating power module (80), thereby allowing the cross-sectional area of each of the axial channels (C1) opposite to the heat-generating power module (80) to be smaller than that of each of the axial channels (C1) near the heat-generating power module (80). Therefore, a large amount of the refrigerant circulates through the axial channels (C1) near the heat-generating power module (80).

In view of the above, according to the thirteenth embodiment, the spacer (59) is formed such that the cross-sectional area of each of some of the axial channels (C1) near the heat-generating power module (80) is larger than that of each of the other axial channels (C1) opposite to the heat-generating power module (80), thereby allowing a large amount of the refrigerant to circulate through a portion of a narrow channel (C0) near the power module (80). This can enhance the cooling performance of a portion of a cooler (50) near the power module (80), and thus, the power module (80) can be efficiently cooled.

<<Fourteenth Embodiment of the Invention>>

In a fourteenth embodiment, the configuration of the cooler body (51) of the ninth embodiment is partially changed.

Incidentally, when, like the ninth embodiment, a channel formation member (54) is formed in the shape of a hollow cylinder, not only a narrow channel (C0) is formed between the channel formation member (54) and a circular pipe member (53), but also an internal channel (C3) through which a refrigerant circulates is formed inside the channel formation member (54). However, with increasing cross-sectional area of the internal channel (C3), the amount of refrigerant circulating through the narrow channel (C0) decreases, and the cooling performance decreases. Therefore, the channel formation member (54) is preferably formed in the shape of a solid cylinder to prevent a channel from being formed inside the channel formation member (54); however, when the channel formation member (54) is formed in the shape of a solid cylinder, this prevents a spacer (59) from being deformed by pressing.

To address this problem, in the fourteenth embodiment, as illustrated in FIGS. 21(A) and 21(B), a channel reducing member (64), and a connection member (65) providing connection between the channel reducing member (64) and a channel formation member (54) are provided inside the hollow cylindrical channel formation member (54). Specifically, the channel reducing member (64) is formed in the shape of a solid cylinder, and is disposed inside the channel formation member (54) and spaced apart from the channel formation member (54). The connection member (65) is formed in the shape of a plate, and radially extends between the channel formation member (54) and the channel reducing member (64) to connect them together. In this embodiment, a structure including the channel reducing member (64) and the connection member (65) is made of a metal, and is connected integrally to the channel formation member (54). While, in this embodiment, only the single connection member (65) is provided, two or more connection members (65) may be provided.

In view of the above, according to the fourteenth embodiment, the solid cylindrical channel reducing member (64) is provided inside the hollow cylindrical channel formation member (54) to reduce the cross-sectional area of the internal channel (C3) formed inside the channel formation member (54), thereby allowing a larger amount of refrigerant to circulate through a portion of the narrow channel (C0) near the power module (80). This can enhance the cooling performance of a portion of a cooler (50) near the power module (80), and thus, the power module (80) can be efficiently cooled.

According to the fourteenth embodiment, the solid cylindrical channel reducing member (64) is disposed inside the hollow cylindrical channel formation member (54) and spaced apart from the channel formation member (54); therefore, when the circular pipe member (53) and the spacer (59) are deformed by pressing so as to be brought into contact with each other such that heat can be transferred therebetween, the deformation of the spacer (59) is not prevented.

<<Fifteenth Embodiment of the Invention>>

In a fifteenth embodiment, the configuration of the cooler body (51) and the configuration of the heat transfer member (52) according to the ninth embodiment are partially changed.

Figure 22:
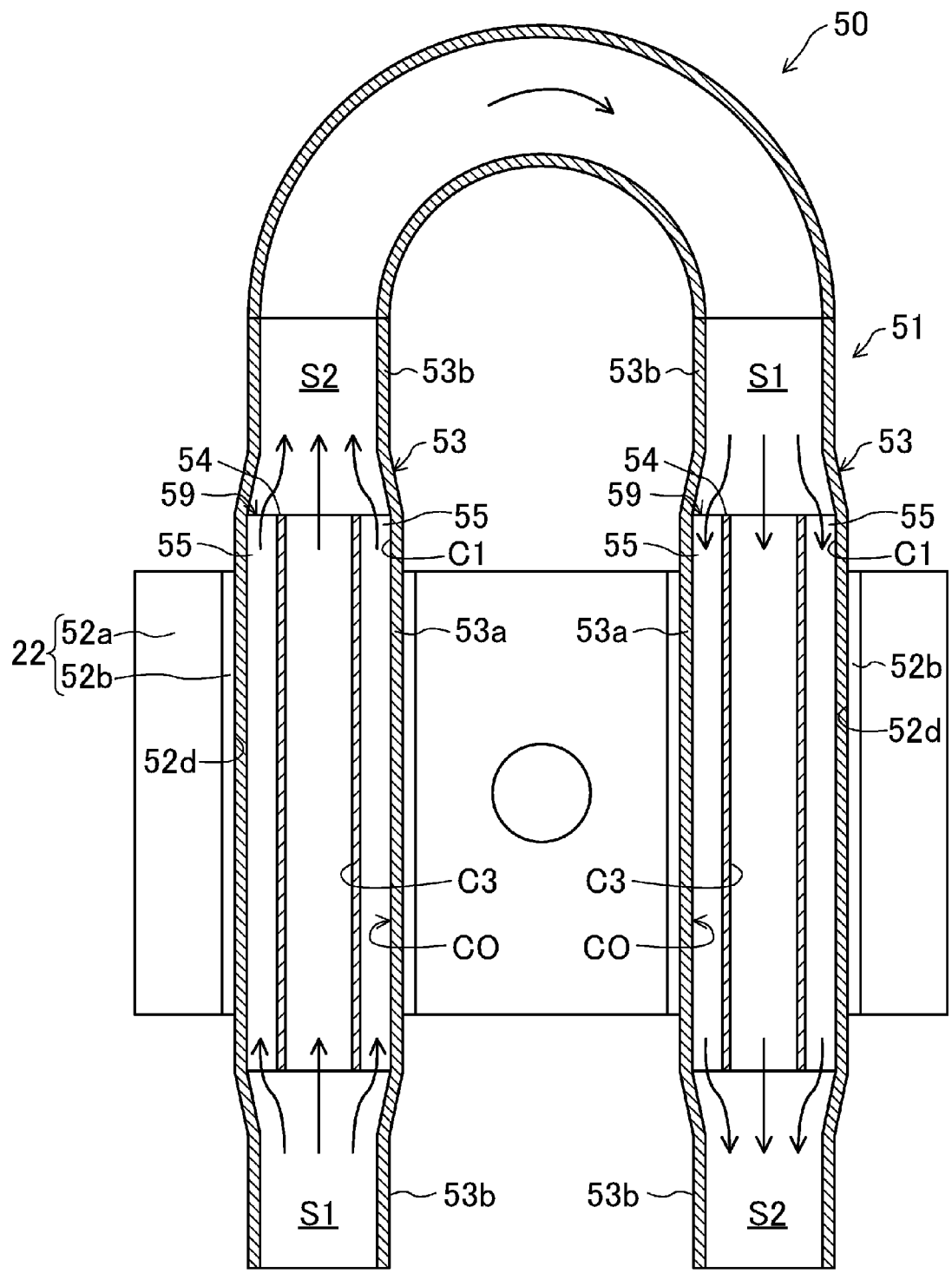
FIG. 22 is a longitudinal cross-sectional view of a cooler according to a fifteenth embodiment.
Figure 23:
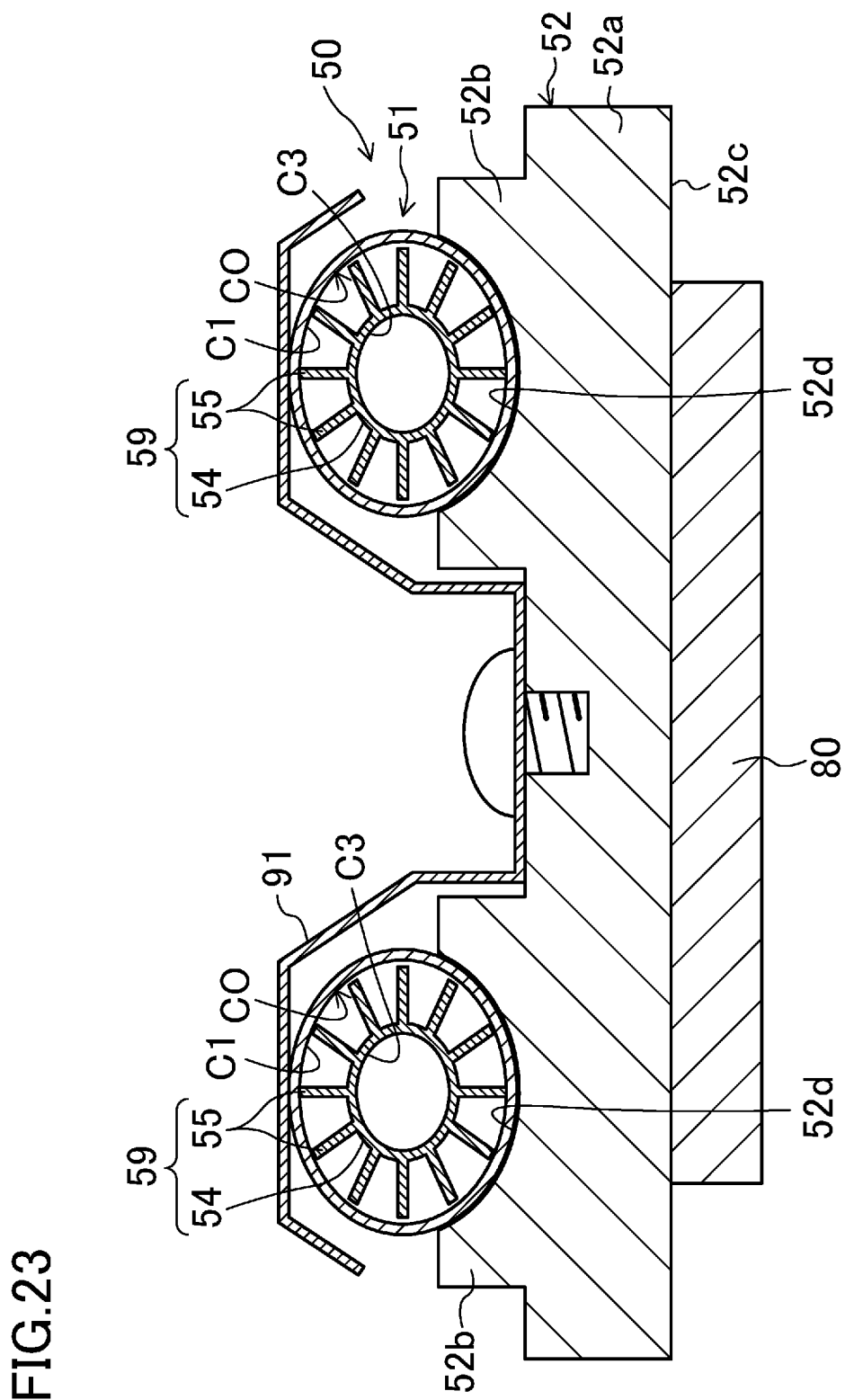
FIG. 23 is a cross-sectional view of the cooler and a power module according to the fifteenth embodiment.

Specifically, while, in the ninth embodiment, the circular pipe member (53) is a single straight pipe member, two straight pipe portions of a U-shaped pipe form circular pipe members (53) as illustrated in FIGS. 22 and 23 in the fifteenth embodiment.

A method for forming a cooler body (51) is similar to that in the ninth embodiment. Specifically, with a spacer (59) inserted into each of the circular pipe members (53) being the two straight pipe portions of the U-shaped pipe, the circular pipe member (53) is pressed toward a power module (80). Thus, two sets each including the circular pipe member (53) and the spacer (59) are deformed into an oval shape, thereby allowing the circular pipe member (53) and the spacer (59) to be in contact with each other such that heat can be transferred therebetween, and to be fixed to each other.

In the fifteenth embodiment, since the circular pipe members (53) are the two straight pipe portions of the U-shaped pipe, the shape of a heat transfer member (52) is deformed. Specifically, the heat transfer member (52) has a plate-like portion (52a) on which the power module (80) is fixed, and two holding portions (52b) on each of which one of the circular pipe members (53) of the cooler body (51) is fixed. The shape and configuration of each of the two holding portions (52b) are similar to those in the ninth embodiment. In the fifteenth embodiment, the two circular pipe members (53) being the two straight pipe portions of the U-shaped pipe are pressed toward recesses (52d) of the heat transfer member (52) with a single presser plate (91) so as to be fixed.

Incidentally, in each of the first through eighth embodiments, the circular pipe member (53) is a single straight pipe member, because, when a U-shaped pipe is used as the circular pipe member (53), the pressure of one of the straight pipe portions against the inner surface of a corresponding one of the recesses (52d) may cause the contact between the other straight pipe portion and the inner surface of the other recess (52d) to be poor depending on the manner in which the U-shaped pipe is finished, and the heat transfer performance may be decreased.

However, like this embodiment, when each of the circular pipe members (53) and a corresponding one of the spacers (59) are pressed to bring them into contact with each other such that heat can be transferred therebetween and to be fixed to each other, the accuracy of the finished circular pipe member (53) is enhanced. Therefore, the pressure of one of the straight pipe portions against the inner surface of a corresponding one of the recesses (52d) is less likely to cause the contact between the other straight pipe portion and the inner surface of the other recess (52d) to be poor than when such pressing as described above is not performed. In other words, such pressing as described above can improve the contact between the cooler body (51) and the heat transfer member (52), thereby reducing the contact thermal resistance. Thus, even when the U-shaped pipe is used as the circular pipe member (53), deterioration in the cooling performance can be prevented.

The configuration may be used in each of the tenth through fourteenth embodiments.

<<Sixteenth Embodiment of the Invention>>

In a sixteenth embodiment, the configuration of the heat transfer member (52) of the fifteenth embodiment is partially changed, and the method for forming the cooler body (51) according to the fifteenth embodiment is changed.

Figure 24:
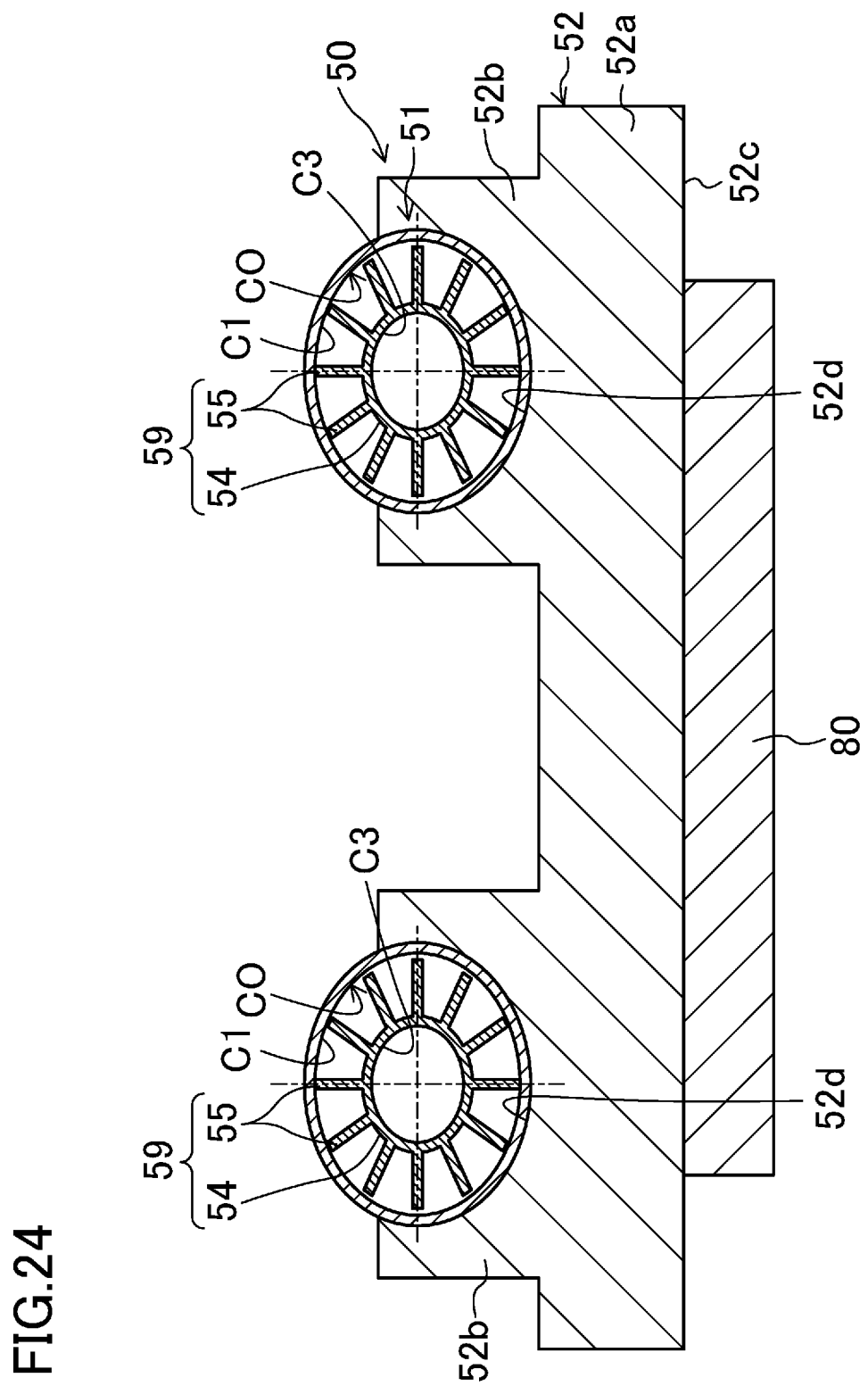
FIG. 24 is a cross-sectional view of a cooler and a power module according to a sixteenth embodiment.

Specifically, as illustrated in FIG. 24, also in the sixteenth embodiment, while, like the fifteenth embodiment, a recess (52d) of each of holding portions (52b) of a heat transfer member (52) is formed in a semioval shape into which a corresponding one of circular pipe members (53) having a cross section deformed into an oval shape is fitted, the depth of the recess (52d) is greater than that of each of the recesses (52d) of the fifteenth embodiment. In the sixteenth embodiment, the recess (52d) has a depth allowing a lower half portion of the corresponding circular pipe member (53) having a cross section deformed into an oval shape and a lower portion of an upper half portion thereof to be covered with the wall of the recess (52d). The recess (52d) has an opening width that is greater than the outside diameter of the circular pipe member (53) before being deformed, and is smaller than the largest outside diameter of the deformed circular pipe member (53).

In the fifteenth embodiment, with each of the circular pipe members (53) and a corresponding one of the spacers (59) pressed to bring them into contact with each other such that heat can be transferred therebetween and to be fixed to each other, they are fitted into the recess (52d) of a corresponding one of the holding portions (52b) of the heat transfer member (52). However, in the sixteenth embodiment, each of the circular pipe members (53) before being pressed is fitted into the recess (52d) of the corresponding holding portion (52b) of the heat transfer member (52), and is squeezed by pressing the circular pipe member (53) in the recess (52d) toward a power module (80), thereby deforming, into the shape of the recess (52d), the circular pipe member (53) into which a spacer (59) is inserted. In this case, in a manner similar to that in the fifteenth embodiment, the spacer (59) and the circular pipe member (53) are deformed in the circular pipe member (53) such that the circular pipe member (53) has an oval cross section, and the circular pipe member (53) and the spacer (59) are in contact with each other such that heat can be transferred therebetween, and are fixed to each other.

In view of the above, according to the sixteenth embodiment, the heat transfer member (52) is used instead of a die for pressing to deform each of the circular pipe members (53) and a corresponding one of the spacers (59) in the recess (52d), thereby enabling fixation between the circular pipe member (53) and the corresponding spacer (59) and fixation of the cooler body (51) to the heat transfer member (52) by a single pressing operation. This can facilitate assembly of the cooler (50).

The above-described configuration of the heat transfer member (52) and the above-described method for forming the cooler body (51) can be also used in each of the ninth through fourteenth embodiments. In other words, in each of the ninth through fourteenth embodiments, the recess (52d) of the heat transfer member (52) may be formed to have a large depth as described above, and the circular pipe member (53) into which the spacer (59) is inserted may be pressed in the recess (52d). Such formation can facilitate assembly of the cooler (50).

<<Other Embodiments>>

In each of the embodiments, the cooler (50) is connected between the outdoor heat exchanger (42) of the refrigerant circuit (20) and the expansion valve (43); however, the location at which the cooler (50) is connected is not limited to the location. The cooler (50) may be provided at any location along a liquid pipe of the refrigerant circuit (20).

While, in each of the first through third embodiments, the partitioning walls (55) are connected integrally to the channel formation member (54), the partitioning walls (55) may be made of a metal and connected integrally to the circular pipe member (53). According to such an embodiment, the area where heat is transferred between a refrigerant flowing through the annular channel (C0) and the circular pipe member (53) is significantly increased to significantly enhance the heat transfer coefficient, and thus, the cooling performance of the cooler (50) can be significantly enhanced.

In the first embodiment, the partitioning walls (55) may be omitted. Even with such an embodiment, a radially narrow channel (C0) for a refrigerant can be formed in a circular pipe member (53) by a channel formation member (54), thereby enhancing the cooling performance of a cooler (50). In the above-mentioned case, for example, when the channel formation member (54) includes the fixing structure (60) of the seventh embodiment, the channel formation member (54) can be fixed to the circular pipe member (53); however, any other methods for fixing the channel formation member (54) thereto may be used.

While, in each of the first through eighth embodiments, the axis of the channel formation member (54) coincides with the axis of the circular pipe member (53), it may be shifted from the axis of the circular pipe member (53). The narrow channel (C0) may have, not an annular cross section, but, e.g., a crescentic cross section.

While, in each of the first through eighth embodiments, the body portion (53a) of the circular pipe member (53) has a larger diameter than each of the connection portions (53b) thereof, the body portion (53a) of the circular pipe member (53) may have substantially the same inside diameter as that of each of the connection portions (53b) thereof.

In each of the ninth through sixteenth embodiments, the spacer (59) is inserted into the circular pipe member (53), and then, the circular pipe member (53) and the spacer (59) are pressed so as to be deformed; however, the spacer (59) may be inserted into the circular pipe member (53), and then, the diameter of the circular pipe member (53) may be reduced to bring the circular pipe member (53) and the spacer (59) into contact with each other such that heat can be transferred therebetween and fix them to each other. Such a configuration can also provide advantages similar to those in the embodiments. Such a method for fixing a channel formation member (54) and partitioning walls (55) as described above can be used also in each of the second, third, and sixth embodiments.

In each of the ninth through sixteenth embodiments, the spacer (59) is inserted into the circular pipe member (53), and then, the circular pipe member (53) and the spacer (59) are pressed so as to be deformed; however, the spacer (59) may be inserted into the circular pipe member (53), and then, the diameter of the hollow cylindrical channel formation member (54) may be increased to bring the circular pipe member (53) and the spacer (59) into contact with each other such that heat can be transferred therebetween and fix them to each other. Such a configuration can also provide advantages similar to those in the embodiments.

In each of the embodiments, the air conditioner (10) was described as an example refrigerating apparatus performing a refrigeration cycle. However, for example, a heat pump-type chiller unit, a hot water supply system, or a cooling apparatus for cooling the inside of a refrigerator or a freezer may be used as the refrigerating apparatus.

INDUSTRIAL APPLICABILITY

As described above, the present invention is useful for coolers through which a heating medium circulates to cool a heat generating component, and refrigerating apparatuses including the same.

DESCRIPTION OF REFERENCE CHARACTERS

10 AIR CONDITIONER (REFRIGERATING APPARATUS)
20 REFRIGERANT CIRCUIT
50 COOLER
51 COOLER BODY
52 HEAT TRANSFER MEMBER
52c MOUNTING SURFACE
52d RECESS
53 CIRCULAR PIPE MEMBER
53a BODY PORTION
53b CONNECTION PORTION
54 CHANNEL FORMATION MEMBER
54a PORTION OF CHANNEL FORMATION MEMBER OPPOSITE TO HEAT GENERATING COMPONENT
54b PORTION OF CHANNEL FORMATION MEMBER NEAR HEAT GENERATING COMPONENT
55 PARTITIONING WALL
56 TURBULENT FLOW ACCELERATOR MEMBER
56a PROTRUDING PIECE
57 HEAT TRANSFER PLATE
58 PARTITIONING WALL
59 SPACER
80 POWER MODULE (HEAT GENERATING COMPONENT)
C0 NARROW CHANNEL
C1 AXIAL CHANNEL
C2 CIRCUMFERENTIAL CHANNEL (DIVISION CHANNEL)
S1 FIRST SPACE (INLET SPACE, OUTLET SPACE)
S2 SECOND SPACE (OUTLET SPACE, INLET SPACE)
P1 FIRST COMMUNICATION PASSAGE (INLET SIDE COMMUNICATION PASSAGE, OUTLET SIDE COMMUNICATION PASSAGE)
P2 SECOND COMMUNICATION PASSAGE (OUTLET SIDE COMMUNICATION PASSAGE, INLET SIDE COMMUNICATION PASSAGE)

The invention claimed is:

1. A cooler including a circular pipe member through which a heating medium circulates, and being in thermal contact with a heat generating component to cool the heat generating component with the heating medium flowing through the circular pipe member, the cooler comprising:
   a channel formation member which axially extends through an interior of the circular pipe member, and between which and an inner circumferential surface of the circular pipe member a narrow channel for the heating medium is formed, wherein the circular pipe member has a body portion in which the channel formation member is provided, and connection portions which are continuous with axial ends of the body portion and are connected to a pipe through which the heating medium circulates, and the body portion has a larger diameter than the connecting portions.

2. The cooler of claim 1, wherein the channel formation member is disposed in the circular pipe member such that the narrow channel forms an annular channel extending along the inner circumferential surface of the circular pipe member.

3. The cooler of claim 2, further comprising:
a plurality of partitioning walls axially extending through the interior of the circular pipe member and circumferentially dividing the narrow channel.

4. The cooler of claim 3, wherein an axially extending heat transfer plate made of a metal is provided between each adjacent pair of the partitioning walls so as to be connected integrally to the circular pipe member.

5. The cooler of claim 3, wherein
a turbulent flow accelerator member is provided between each adjacent pair of the partitioning walls.

6. The cooler of claim 5, wherein the turbulent flow accelerator member includes a plurality of protruding pieces connected integrally to the channel formation member by injection-molding a resin.

7. The cooler of claim 3, wherein the plurality of partitioning walls are connected integrally to the channel formation member by injection-molding a resin.

8. The cooler of claim 2, wherein the heating medium circumferentially flows through the narrow channel.

9. The cooler of claim 8, further comprising:
a plurality of partitioning walls axially dividing the narrow channel in the circular pipe member into a plurality of circumferentially extending division channels, wherein
the channel formation member includes an inlet side communication passage providing communication between a heating medium inlet space formed near one axial end of the channel formation member and each of the division channels, and an outlet side communication passage providing communication between an outlet space formed near the other axial end of the channel formation member and each of the division channels.

10. The cooler of claim 3, wherein
the plurality of partitioning walls are made of a thermally conductive material, and connected integrally to the channel formation member to form a spacer defining a channel for the heating medium, and
with the spacer located in the circular pipe member, at least one of the circular pipe member or the spacer is deformed to bring the circular pipe member and the spacer into contact with each other such that heat can be transferred between the circular pipe member and the spacer, and to fix the circular pipe member and the spacer to each other.

11. The cooler of claim 10, wherein
the channel formation member is formed in a hollow cylindrical shape,
with the spacer located in the circular pipe member, the circular pipe member and the spacer are both deformed by being pressed in a predetermined direction to be in contact with each other such that heat can be transferred between the circular pipe member and the spacer, and to be fixed to each other.

12. The cooler of claim 11, wherein the circular pipe member and the spacer are pressed such that a curvature of a portion of the circular pipe member near the heat generating component is larger than a curvature of a portion of the circular pipe member opposite to the heat generating component.

13. The cooler of claim 11, wherein the spacer is formed such that a rigidity of a portion of the spacer near the heat generating component is lower than a rigidity of a portion of the spacer opposite to the heat generating component.

14. The cooler of claim 13, wherein a portion of the channel formation member near the heat generating component is thinner than a portion of the channel formation member opposite to the heat generating component.

15. The cooler of claim 11, wherein the spacer is formed such that a cross-sectional area of one, near the heat generating component, of a plurality of axial channels into which the narrow channel is circumferentially divided by the plurality of partitioning walls is larger than a cross-sectional area of one of the axial channels opposite to the heat generating component.

16. The cooler of claim 1, further comprising:
a heat transfer member having a recess into which the circular pipe member is fitted, and a mounting surface on which a heat dissipation surface of the heat generating component is placed, and configured to transfer heat absorbed by the mounting surface to the recess.

17. A cooler including a circular pipe member through which a heating medium circulates, and being in thermal contact with a heat generating component to cool the heat generating component with the heating medium flowing through the circular pipe member, the cooler comprising:
a channel formation member which axially extends through an interior of the circular pipe member, and between which an inner circumferential surface of the circular pipe member a narrow channel for the heating medium is formed; and
a heat transfer member having a recess into which the circular pipe member is fitted, and a mounting surface on which a dissipation surface of the heat generating component is placed, and configured to transfer heat absorbed by the mounting surface of the recess,
wherein the recess is formed in a surface of the heat transfer member opposite to the mounting surface at a location corresponding to the heat generating component mounted on the mounting surface.

18. The cooler of claim 16, wherein the circular pipe member is one straight pipe member.

19. A refrigerating apparatus comprising:
a refrigerant circuit through which a refrigerant circulates to perform a vapor compression refrigeration cycle, wherein
the cooler of claim 1 is connected to a liquid pipe of the refrigerant circuit.

* * * * *